United States Patent [19]

Calviello et al.

[11] Patent Number: 5,341,114
[45] Date of Patent: Aug. 23, 1994

[54] INTEGRATED LIMITER AND AMPLIFYING DEVICES

[75] Inventors: Joseph A. Calviello, Kings Park; John A. Pierro, East Meadow, both of N.Y.

[73] Assignee: AIL Systems, Inc., Deer Park, N.Y.

[21] Appl. No.: 608,219

[22] Filed: Nov. 2, 1990

[51] Int. Cl.5 .................. H03G 11/04; H03G 3/20; H01P 1/22; H03F 3/14
[52] U.S. Cl. .................. 333/17.2; 333/81 A; 330/135; 330/307; 330/4.9
[58] Field of Search .................. 333/17.2, 81 A; 330/135, 307, 4.9, 298

[56] References Cited

U.S. PATENT DOCUMENTS

| | | | |
|---|---|---|---|
| 4,098,921 | 7/1978 | Calviello | 427/53 |
| 4,131,858 | 12/1978 | Niehenke et al. | 330/4.9 |
| 4,301,233 | 11/1981 | Calviello | 430/314 |
| 4,665,413 | 5/1987 | Calviello | 357/15 |
| 4,789,645 | 12/1988 | Calviello et al. | 437/51 |
| 4,810,980 | 3/1989 | Heston et al. | 333/81 A |
| 4,876,176 | 10/1989 | Calviello et al. | 430/311 |
| 5,047,829 | 9/1991 | Seymour et al. | 333/17.2 |

FOREIGN PATENT DOCUMENTS

| | | |
|---|---|---|
| 0149065 | 7/1985 | European Pat. Off. |
| 0296675 | 12/1988 | European Pat. Off. |
| 1284349 | 8/1972 | United Kingdom |
| 1450959 | 9/1976 | United Kingdom |
| 2030387 | 4/1980 | United Kingdom |
| 2187595 | 9/1987 | United Kingdom |

OTHER PUBLICATIONS

"High Performance GaAs Quasi-Planar Varactors for Millimeter Waves", J. Calviello et al, IEEE Trans. an Elect. Devices, vol. ED 21, No. 10, Oct. 1974, pp. 624-630.
"An Improved High Temperature GaAs Schottky Junction", J. Calviello et al Conf. on Active Semiconductor Devices for Microwves and Integrated Optics, Cornell Uiversity, Ithaca, N.Y., Aug. 19-21, 1975.
"Performance and Reliability of an Improved High-Temperature GaAs Schottky Junction and Native-Oxide Passivation", J. A. Calviello et al, IEEE Trans. an Elect. Devices vol. ED 24, No. 6, Nov. 1977, pp. 798-704.
"Wide-Band Subharmonically Pumped W-Band Mixer in Single-Ridge Fin-Line" P. J. Meier et al, IEEE Trans. on MTT-S vol. MTT-30, No. 12, Dec. 1982.
"First Successful Fabrication of High-Performance All-Refractory-Metal (Ta-Au) GaAs FET Using Very Highly Doped N+ Layers and Nonalloyed Ohmic Contacts", J. A. Calviello et al, Electronic Letters, vol. 22, No. 10, May 1986, pp. J10-J12.
"Ka-Band Front End With Monolithic Hybrid, and Lumped-Element IC's", P. Meier et al, IEEE Transaction on MTT vol. 34. No. 4, Apr. 1986.
"A High-Performance, Quasi-Monolithic 2 to 18 GHz Distributed GaAs FET Amplifier", A. Cappello et al, MTT-S 1987 Symposium, Las Vegas, Nevada.
"Integration of High-Q GaAs Varactor Diodes and 0.25 μm GaAs MESFET's for Multifunction Millimeter-Wave Monolithic Circuit Applications", M. Gary McDermott et al, IEEE Trans on Microwave Theory and Techniques, vol. 38, No. 9, Sep 1990, pp. 1183-1190.

*Primary Examiner*—Gregory C. Issing
*Attorney, Agent, or Firm*—Andrus, Sceales, Starke & Sawall

[57] ABSTRACT

Integrated circuit structure and processing is provided for a high power limiter including at least a first antiparallel array of monolithically integrated Schottky diodes. In a further embodiment, integrated circuit structure and processing is provided for an MMIC, microwave and millimeter wave monolithic integrated circuit, including an amplifier and a high power limiter monolithically integrated on the same substrate.

12 Claims, 16 Drawing Sheets

SMALL-SIGNAL

LARGE-SIGNAL (OFF-STATE)

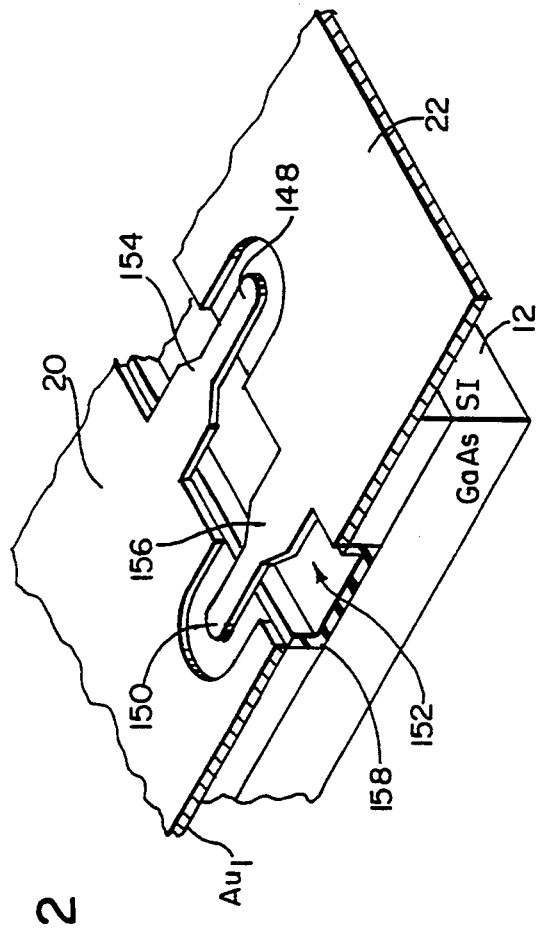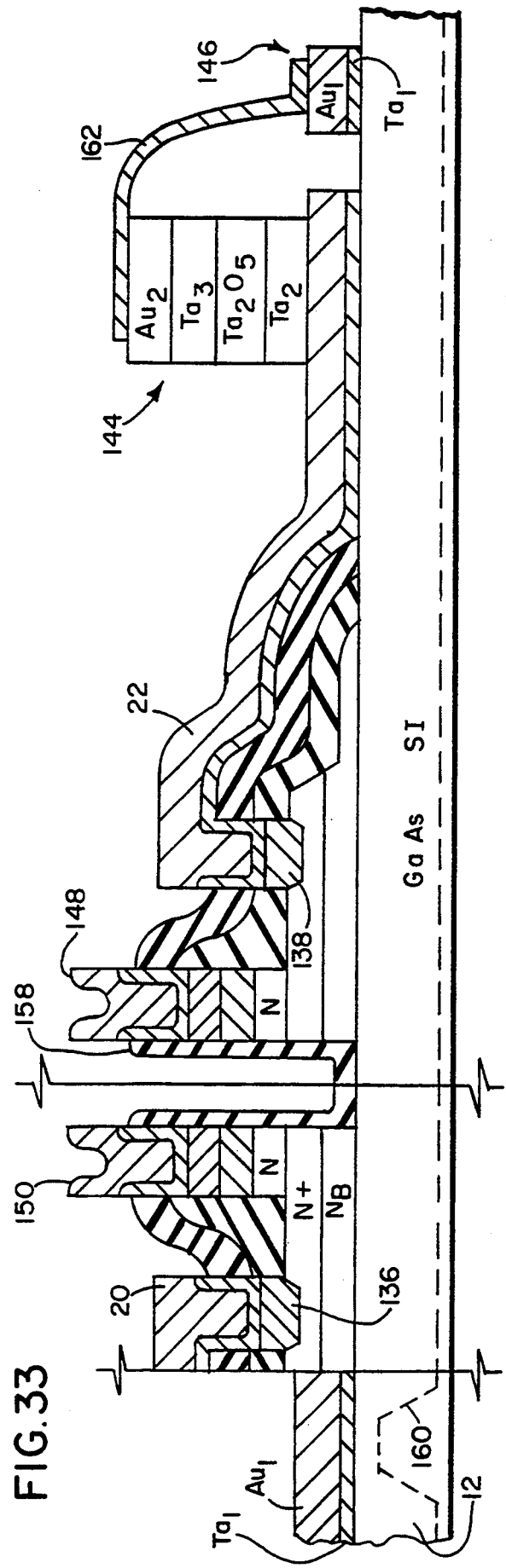
FIG.32
FIG.33

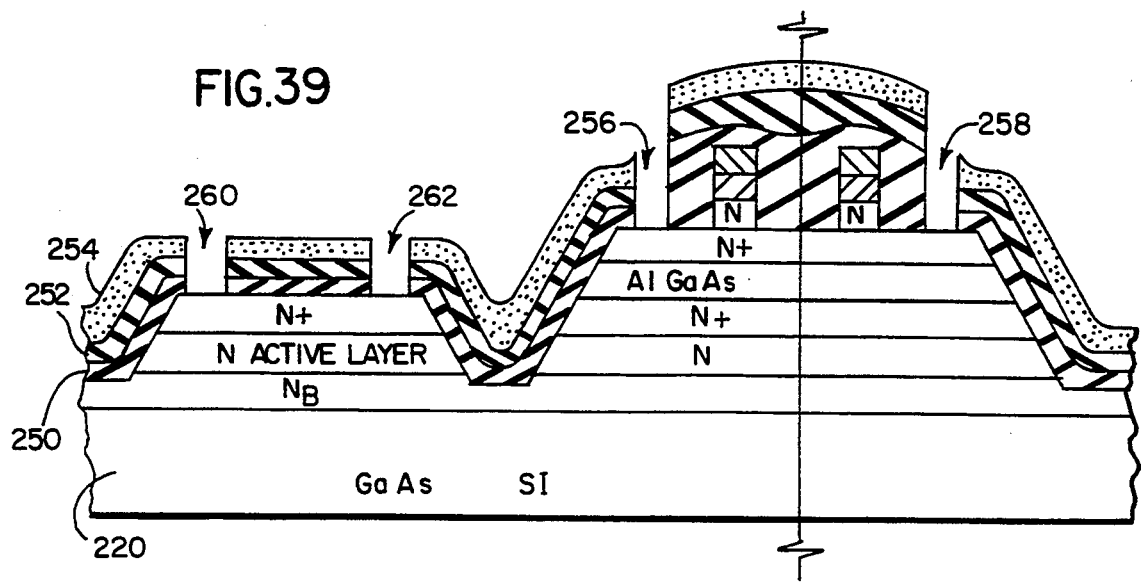
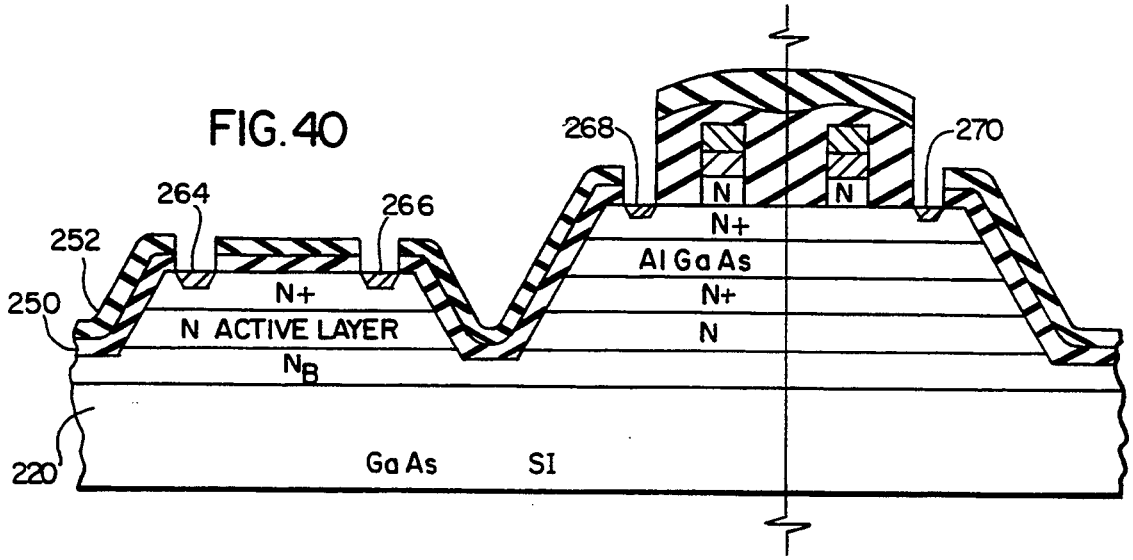
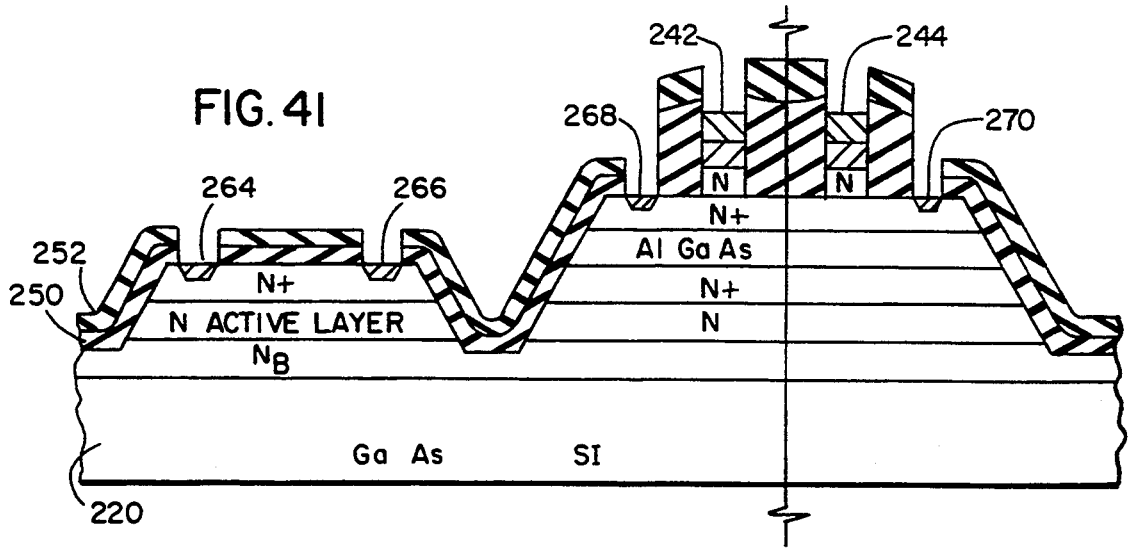

INTEGRATED LIMITER AND AMPLIFYING DEVICES

BACKGROUND AND SUMMARY

The invention relates to microwave and millimeter wave monolithic integrated circuits (MMIC), and more particularly to protection of high performance low noise receiver amplifiers from excessive rf input power, spike leakage, and electromagnetic pulses.

It is known in the prior art to provide high power limiters formed of silicon PIN diodes to protect low noise receiver amplifiers operating in the microwave to millimeter wave frequency ranges. A drawback of PIN diodes is that they are not GaAs MMIC compatible, and hence are not monolithically integratable with the receiver amplifier. This in turn requires the forming of discrete devices which are later connected in a circuit which then must be noise matched, adjusted, etc. for various resistance, capacitance, inductance and parasitic values.

The present invention overcomes the drawbacks of non-MMIC compatible limiters and provides the capability to protect low noise receiver amplifiers operating in the microwave to millimeter wave frequency ranges. The present invention adapts MOTT-barrier Schottky junctions with MMIC compatible processing to provide a limiter formed by an anti-parallel array of Schottky junctions monolithically integrated on the same substrate with the low noise receiver amplifier. The invention enables the formation of matrix junction arrays in accordance with system power protection requirements as well as monolithically integrating the limiter formed thereby with the low noise receiver amplifying elements, including MESFETs, HEMTs, HBTs, etc. The MMIC compatibility also provides the tools to reduce volume, size, weight, and cost, as well as parasitic elemental values in order to efficiently operate at very high frequencies. Furthermore, it has been found that the present approach is more effective against spike leakage and radiation tolerance than PIN diode limiters.

In one aspect of the invention, a Schottky diode array is embedded in an on-chip low pass impedance matching structure that transforms 50 ohms to $Z_{opt}$, the source impedance required for the minimum FET noise figure. By absorbing the diode's junction capacitance, $C_{jo}$, into the low pass structure, the bandwidth is maximized and the noise is minimized. Thus, it is possible to achieve a noise matched rf protected low noise receiver amplifier that only requires an output matching network to make it a complete low noise module. No further input matching is required. Eliminating the need for a separate noise matching network results in at least several tenths of dB reduction in input losses and a corresponding reduction in the amplifier noise figure.

The Schottky diode based high power limiter technology of the present invention provides solutions to many of the problems of PIN diode limiters, and provides superior insertion loss at microwave and millimeter wave frequencies, excellent spike and flat leakage performance, and total compatibility with MMIC fabrication techniques. Limiters in accordance with the invention having a pulsed power handling capability in excess of 100 watts, and insertion losses as much as 1 dB less than that of PIN diode limiters of comparable power handling capability, have been achieved up through 30 GHz. Spike leakage is a major problem with slow responding PIN diodes. Limiters in accordance with the invention have measured in the $1.0 \times 10^{-9}$ joules range, a factor of 10 lower than an accepted safe lower limit for sub 0.5 micron gallium arsenide FETs and HEMTs.

In another aspect of the invention, high performance limiters have been fabricated using molecular beam epitaxy. This yields active layers having ultra-sharp doping profiles for lowest series resistance and highest cutoff frequency. This enables production of rf protected millimeter wave transistors, including 0.25 micron gate length millimeter wave FETs having nearly 5 dB of gain at 35 GHz. The quarter micron gates can be defined by electron beam lithography.

The processes for the Schottky diodes and for the receiver amplifier, including a gallium arsenide FET, are MMIC compatible, and further accommodate integration of passive resistors, inductors, and capacitors, as well as transmission lines. In addition to the limiting action that occurs when the diode is driven to its low resistance state, the diode's junction capacitance under forward bias increases by a factor of nearly three, shifting the cutoff frequency of the matching structure to a point below the operating band, resulting in additional isolation.

As noted above, PIN diode limiter technology is subject to limitations for low noise amplifier protection. These limitations include: high insertion loss, typically 2 dB up to 18 GHz and 4 dB up to 40 GHz for pulsed power levels of 10 watts, two microsecond pulse width; flat leakage levels that often exceed 100 milliwatts, which could damage HEMT low noise amplifiers; and spike leakage levels up to $100 \times 10^{-9}$ joules which would damage most MESFETs and HEMTs. Furthermore, the material and processing are totally incompatible with MMIC fabrication techniques, precluding integration of the limiter function with the low noise amplifier. In one embodiment of the present invention, pulsed levels up to 45 dBm can be handled, and still achieve an insertion loss of approximately 0.7 dB and an isolation of over 20 dB with 45 dBm applied at 16 GHz. Two microsecond pulses up to 45 dBm are safely handled by a single anti-parallel pair of diodes (1×1 array). A 2×2 array provides power handling capability of 54 dBm.

BRIEF DESCRIPTION OF THE DRAWINGS

Prior Art

Present Invention

Figure 5:
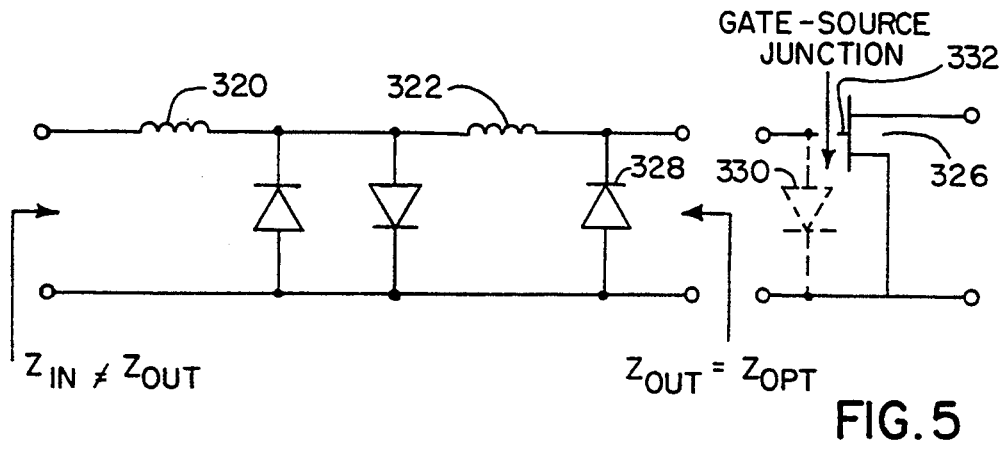

FIG. 5 is a schematic circuit diagram of ladder filter structure in accordance with the invention.

Figure 6:
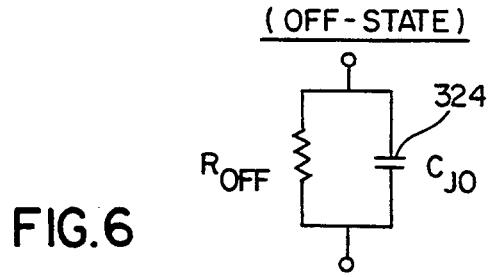

FIG. 6 shows a diode equivalent circuit for one of the diodes of FIG. 5 in the off state.

Figure 7:
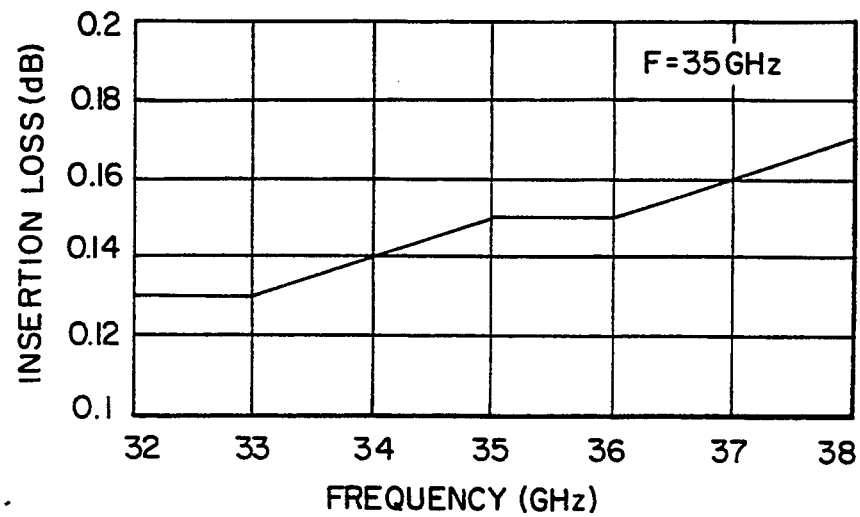
Figure 10:
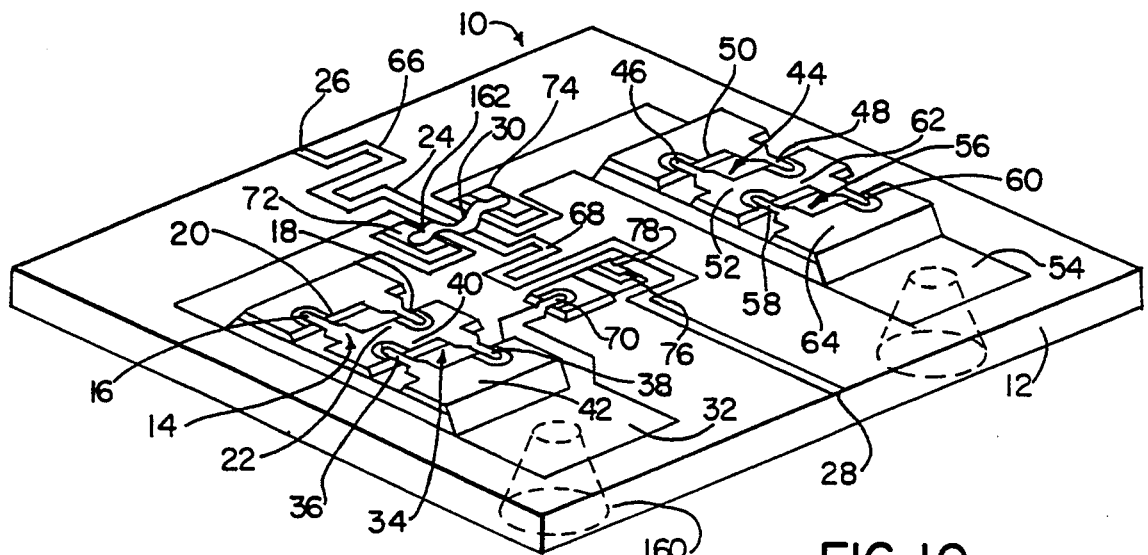

FIG. 7 is a plot of frequency versus insertion loss, showing insertion loss of the limiter of FIG. 10.

Figure 8:
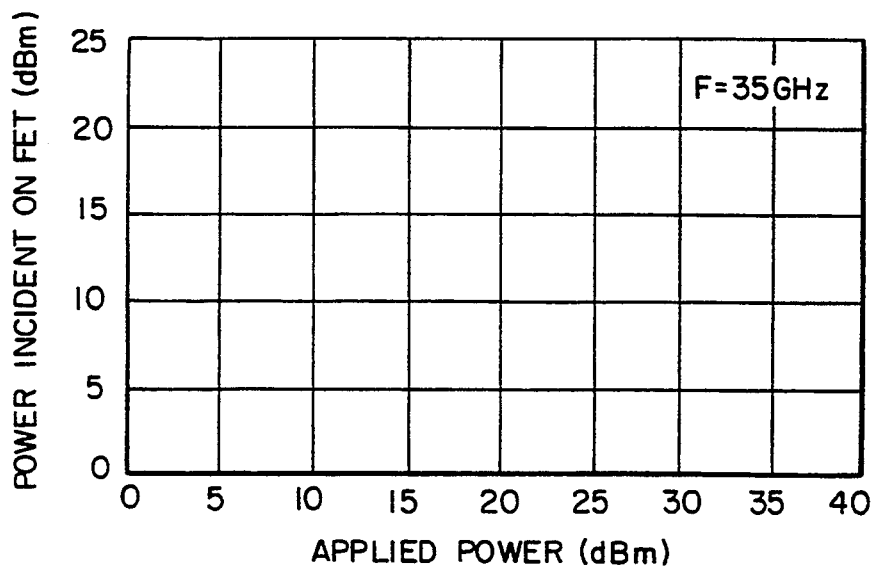
Figures 34, 35:
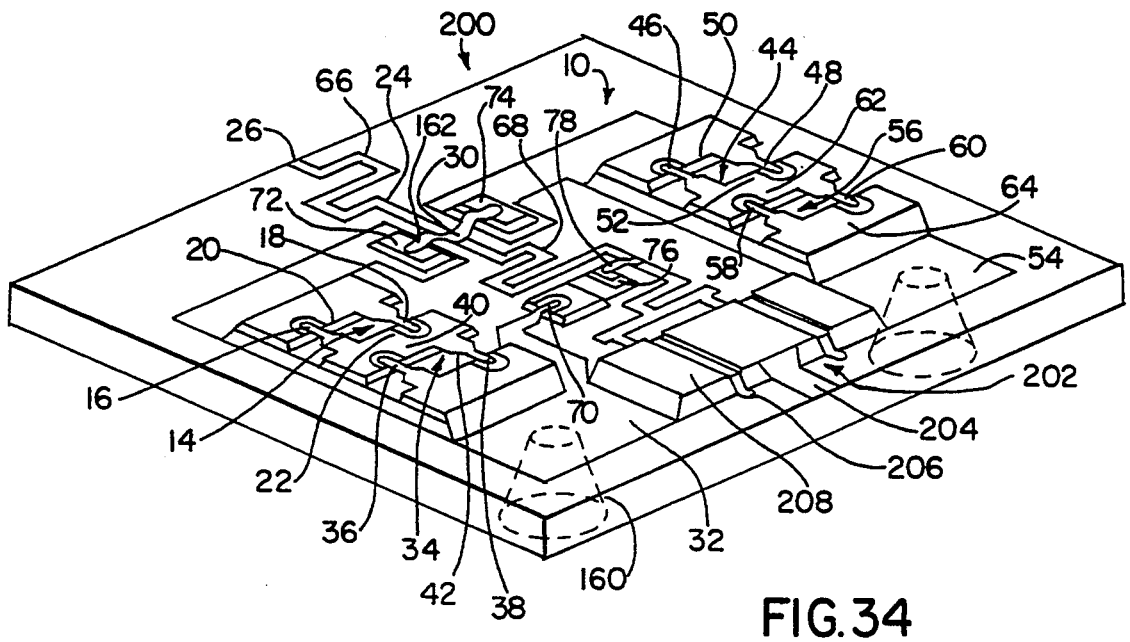

FIG. 8 is a plot of applied power versus power incident on FET 202 of FIG. 34.

Figure 9:
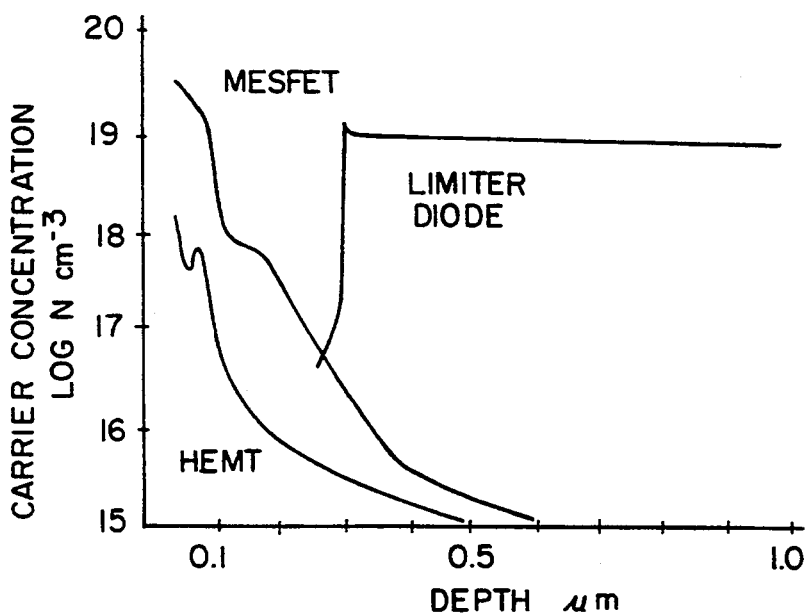

FIG. 9 is a plot of depth versus carrier concentration, showing doping profiles of MBE grown active layers for a limiter diode, MESFET and HEMT.

FIG. 10 shows a high power limiter integrated circuit constructed in accordance with the invention.

Figure 11:
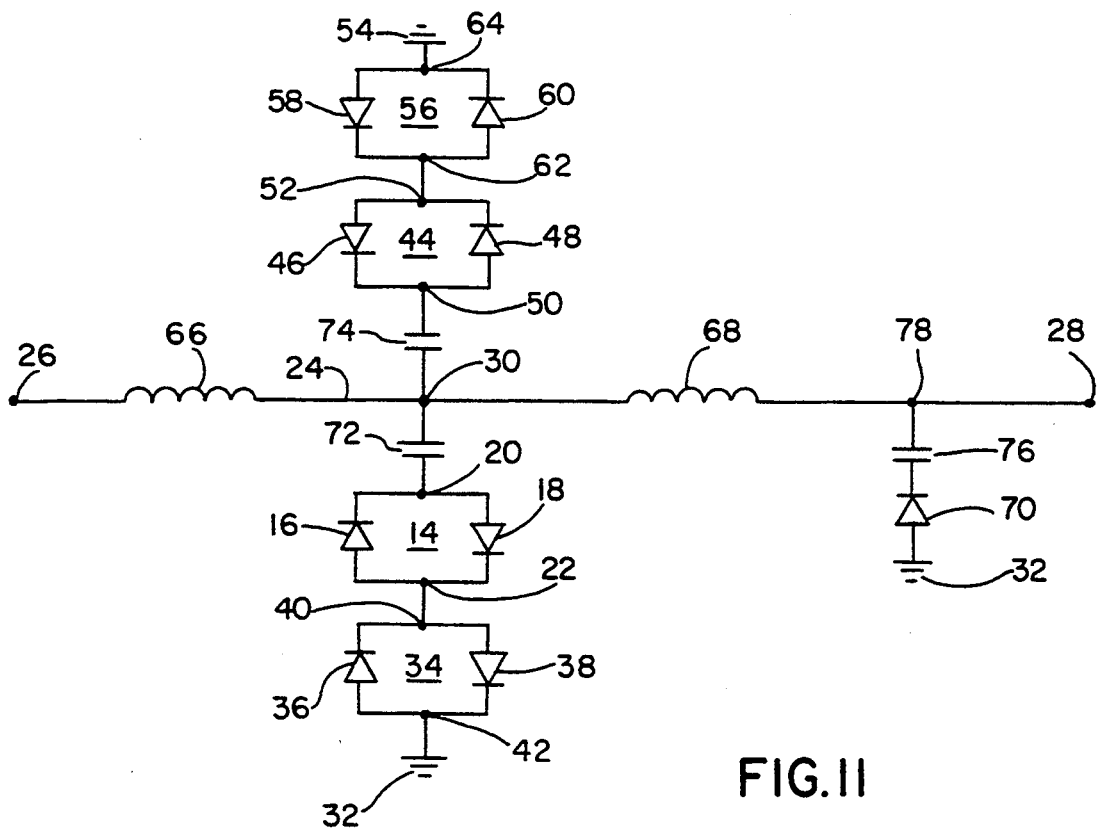

FIG. 11 is an electric circuit diagram of the circuit of FIG. 10.

FIGS. 12–33 illustrate the sequential processing steps for fabricating the structure of FIG. 10.

FIG. 34 shows a microwave and millimeter wave monolithic integrated circuit constructed in accordance with the invention.

FIG. 35 is an electric circuit diagram of the circuit of FIG. 34.

FIGS. 36–50 illustrate the sequential processing steps for fabricating the structure of FIG. 34.

DETAILED DESCRIPTION

Prior Art

Figure 1:
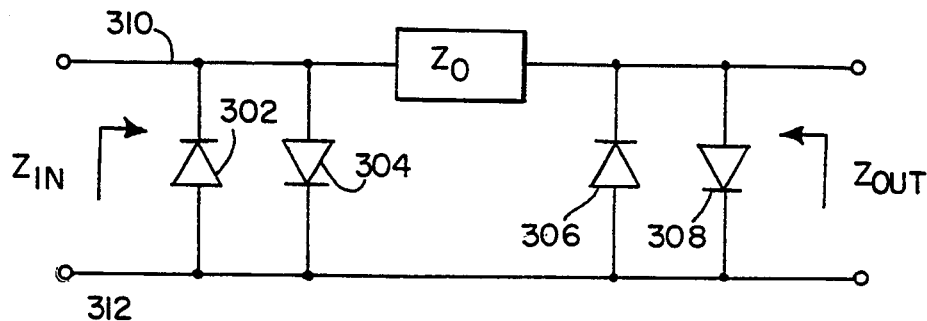
FIG. 1 is a schematic diagram of a conventional receiver protection circuit.
Figure 2:
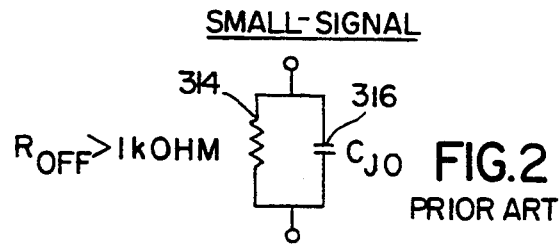
FIG. 2 shows the diode equivalent circuit for each of the diodes of FIG. 1 for the small signal state.
Figure 3:
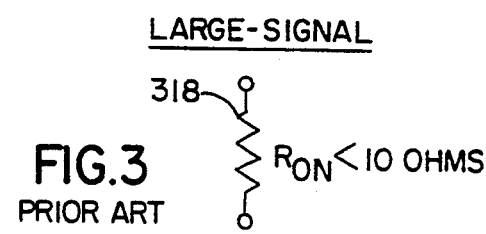
FIG. 3 shows the diode equivalent circuit for each of the diodes of FIG. 1 for the large signal state.

Conventional receiver protection circuits employ one or more diodes such as 302, 304, 306, 308, FIG. 1, connected across a transmission line 310, 312. In the small signal state, the diodes are not conducting and thus appear as a very high resistance 314, FIG. 2, in parallel shunt with the diode zero-bias junction capacitance 316 shown at $C_{jo}$. In the large signal state, the diodes present a low resistance 318, FIG. 3, and therefore a large reflection coefficient to the incident power, reflecting most of it. The input impedance is shown at $Z_{in}$, the output impedance is shown at $Z_{out}$, and the characteristic line impedance is shown at $Z_0$. Because of the presence of the reactive element $C_{jo}$, the protection circuit will exhibit increasing insertion loss with increasing frequency unless compensation is provided.

Figure 4:
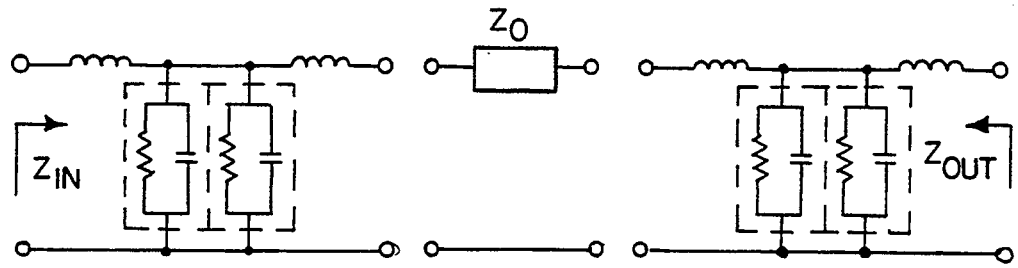
FIG. 4 is a schematic circuit diagram of diodes embedded in low pass ladder filter structure.

By embedding the diode in the filter structure shown in FIG. 4, an all pass transfer function can be approximated over a fairly wide frequency range. The filter structure, typically a low pass ladder, absorbs the junction capacitance, thereby extending the frequency range of operation to $f_c$, the cutoff frequency of the resulting filter. The filter is typically designed to have equal input and output impedances, $Z_{in}$ and $Z_{out}$, e.g. 50 ohms, to allow the protection circuit to be inserted in the signal path of a 50 ohm system with minimal effect.

Present Invention

In the present invention, FIG. 5, the filter structure has unequal input and output impedances, $Z_{in}$ and $Z_{out}$. The filter network parameters, including inductances 320, 322, and the $C_{jo}$ capacitance 324, FIG. 6, $Z_{out}$ is transformed to a low, complex value, with $Z_{in}$ typically equal to 50 ohms. $Z_{out}$ is made equal to $Z_{opt}$, the source impedance required for the minimum transistor noise figure $F_{min}$, for transistor 326, and the filter also functions as the noise matching network for transistor 326.

This eliminates the need for a separate matching network with its attendant loss which would add directly to the transistor noise figure $F_{min}$. The result is superior gain and noise performance relative to the performance obtained with a conventional approach that uses a 50 ohm limiter followed by a noise matched transistor.

In FIG. 5, the filter structure makes use of the FET gate-source junction as one element of an anti-parallel pair of diodes 328, 330 to achieve symmetric clipping of voltage waveform at the gate 332 of the FET when rectifying diodes are used as limiting elements. This reduces circuit complexity and circuit losses because one less diode is required.

A property of diodes under forward bias wherein the junction capacitance increases by nearly a factor of three relative to the zero bias capacitance is used to increase the isolation of the limiter in narrow-band applications, e.g. up to 20% bandwidth. By making the filter cutoff frequency slightly higher than the upper frequency of the operating band, additional isolation is obtained as the filter cutoff frequency is shifted down in frequency due to the increase in capacitance that occurs when a large signal is applied.

The present invention provides novel Schottky diode based, high power limiter technology affording solutions to many of the problems of PIN diode limiters. Advantages of the present invention include superior insertion loss at microwave and millimeter wave frequencies, excellent spike and flat leakage performance, and compatibility with MMIC fabrication techniques. Limiters having a pulsed power handling capability in excess of 100 watts, and insertion losses as much as 1 db less than that of PIN diode limiters of comparable power handling capability, have been demonstrated up through 30 GHz. Spike leakage is a major problem with slow responding PIN diodes. Limiters in accordance with the present invention measure in the $1.0 \times 10^{-9}$ joules range, a factor of 10 lower than the usual safe lower limit for sub 0.5 micron GaAs FETs and HEMTs.

The high performance Schottky diodes are preferably fabricated using epitaxial layers grown by molecular beam epitaxy. This yields active layers having ultrasharp doping profiles as shown in FIG. 9 and very high ($\geq 10^{19}$ cm$^{-3}$) N+ layers for lowest resistance and highest cutoff frequency. The above growth process also makes possible the fabrication of 0.25 micron gate length millimeter wave FETs having nearly 5 dB of gain at 35 GHz. The process for both the Schottky diode and the FET are MMIC compatible, and hence permit integration of the two on a common substrate. Furthermore, the process accommodates the integration of passive resistances, inductances, and capacitances, as well as transmission lines. The Schottky diode array is embedded in an on-chip low pass impedance matching structure that transforms 50 ohms to $Z_{opt}$, the source impedance required for minimum GaAs FET noise figure. By absorbing the diodes junction capacitance, $C_{jo}$, into the low pass structure, the bandwidth is maximized and the loss is minimized. There is thus achieved a noise matched rf protected transistor that only requires an output matching network to make it a complete low noise amplifier module. No further input matching is required. In addition to the limiting action that occurs when the diode is driven to its low resistance state, a factor of nearly three increase in the diode's junction capacitance under forward bias shifts the cutoff frequency of the matching structures to a point below the operating band, resulting in additional isolation. The present approach to integrating the protective limiter function with the transistor offers numerous performance advantages over conventional approaches, including noise figure and gain. Eliminating the need for a separate noise matching network results in several tenths of a db reduction in input losses and a corresponding reduction in amplifier noise figure.

The maximum available gain of the limiter of FIG. 10, to be described, is plotted in FIG. 7. Incident power to the FET of FIG. 34, to be described, versus applied power up to an input of 10 watts is plotted in FIG. 8. With 10 watts applied, the incident power is +19.5 dBm. This is considered safe for a 0.25 micron GaAs FET. If it is determined that a flat leakage level of +19.5 dBm is excessive, an additional limiter section can be included or further optimization of the diode design parameters can be easily performed to lower the level. Array 14, FIGS. 10 and 11, is a typical 1×1 array. Arrays 14 and 34 together form a 1×2 array. Arrays 14, 34, 44, 56 together form a 2×2 array. Various other array configurations may be fabricated.

The limiter technology of the present invention includes numerous desirable characteristics. A MOTT-barrier junction is used to achieve lowest series resistance. Batch processing is used to define monolithic arrays of diodes. The diode junction can be integrated if desired with a diamond heat sink to achieve low thermal resistance, e.g. less than 80° C. per watt. Refractory and gold metallurgies are used for highest reliability. Plasma dry etch processes are used to accurately define small junction areas corresponding to $C_{jo} \leq 0.05$ pf. Active epilayers with high carrier concentration are used to achieve excellent radiation hardening. Molecular beam epitaxy is employed to grow epitaxial layers having extremely sharp N/N+ interfaces, yielding devices with nearly ideal MOTT-barrier characteristics. Typical doping profiles for diodes, FETs and HEMTs are shown in FIG. 9. Using the above noted technology and processing, devices have been developed with the following characteristics: thermal resistance $\leq 80°$ C. per watt for $C_{jo}=0.1$ pf, with diamond heat sink bonded to the junctions; on resistance $\leq 1.5$ ohms, with $C_{jo}=0.1$ pf; on resistance $\leq 2.5$ ohms, with $C_{jo}=0.007$ pf; ideality factor $n \leq 1.08$; series inductance $L_s \leq 0.2$ nH; shunt capacitance $cp \leq 0.02$ pf; I-V characteristics satisfying the thermionic emission equation; $\Delta C/\Delta V = 0$, which is indicative of a MOTT-barrier, where $\Delta C$ is the change in capacitance, and $\Delta V$ is the change in voltage. In a further desirable aspect of the invention, for lowest possible resistance, the ohmic contact is placed within 4 microns of the junction periphery and recessed within the N+ layer which has a carrier concentration of $\geq 1 \times 10^{19}$ cm$^{-3}$, FIG. 9. The latter also reduces skin effect contribution.

FET 202, FIG. 34, is a 0.25 micron gate length MESFET exhibiting the following dc and rf characteristics, including: a transconductance of 250 mS/mm; 2.3 dB noise figure at 18 GHz, a noise figure of 4.2 dB at 40 GHz; and a maximum available gain of 5 dB at 35 GHz. It is anticipated that with additional optimization the noise figure will be $\leq 1.9$ dB at 18 GHz, and $\leq 4.0$ dB at 40 GHz. It is also anticipated that further development of HEMT technology using molecular beam epitaxy will surpass the above stated MESFET performance.

FIG. 10 shows a high power limiter 10 for a low noise amplifier. The limiter includes a substrate 12, a first anti-parallel array 14 of Schottky diodes 16, 18 monolithically integrated on substrate 12. Diodes 16 and 18 are arranged in parallel, FIG. 11, in an reverse polarity relative to each other between a first input node 20 and a first output node 22. A conductor 24 on substrate 12 has a first end 26 providing a limiter input for receiving a signal, and second end 28 providing a limiter output for connection to a low noise amplifier, such as a FET, HEMT, etc. Input node 20 is coupled to conductor 24 at connection node 30 intermediate ends 26 and 28. Node 22 is coupled to ground reference 32.

Another anti-parallel array 34 of Schottky diodes 36, 38 is monolithically integrated on substrate 12 and coupled in series with array 14 between conductor 24 and ground reference 32. Schottky diodes 36 and 38 are arranged in parallel and in reverse polarity relative to each other between an input node 40 and an output node 42. Input node 40 is coupled to output node 22. Output node 42 is coupled to ground reference 32.

Another anti-parallel array 44 of Schottky diodes 46, 48 is monolithically integrated on substrate 12 and coupled in parallel with array 14 between conductor 24 and the ground reference. Schottky diodes 46 and 48 are arranged in parallel and in reverse polarity relative to each other between input node 50 and output node 52. Input node 50 is coupled to conductor 24 at connection node 30 intermediate ends 26 and 28. Output node 52 is coupled to the ground reference at 54.

Another anti-parallel array 56 of Schottky diodes 58 and 60 is monolithically integrated on substrate 12 and coupled in series with array 44 between conductor 24 and the ground reference at 54. Schottky diodes 58 and 60 are arranged in parallel and in reverse polarity relative to each other between input node 62 and output node 64. Input node 62 is coupled to output node 52. Output node 64 is coupled to the ground reference at 54.

Limiter 10 provides impedance transformation and matching for a low noise amplifier without a separate noise matching network. Conductor 24 includes inductors 66, 68 transforming the impedance at input end 26 to a different impedance at the output end 28 matching the low noise amplifier. Inductors 66 and 68 are connected in series with each other between ends 26 and 28. Nodes 20 and 50 are coupled to conductor 24 at connection node 30 intermediate inductors 66 and 68.

Another Schottky diode 70 and resonating capacitors 72, 74, 76 are monolithically integrated on substrate 12. Resonating capacitor 72 and arrays 14 and 34 are connected in series between the ground reference at 32 and conductor 24 at connection node 30 intermediate inductors 66 and 68. Resonating capacitor 72 tunes out the parasitic inductance of Schottky diodes 16, 18, 36, 38 to reduce the reactive portion of the diode impedance. Resonating capacitor 74 and arrays 44 and 56 are connected in series between the ground reference at 54 and conductor 24 at connection node 30 intermediate inductors 36 and 38. Resonating capacitor 74 tunes out the parasitic inductance of Schottky diodes 46, 48, 58, 60 to reduce the reactive portion of the diode impedance. Schottky diode 70 and resonating capacitor 76 are connected in series between the ground reference at 32 and conductor 24 at connection node 78 intermediate inductor 68 and conductor end 28. Resonating capacitor 76 tunes out the parasitic inductance of Schottky diode 70 to reduce the reactive portion of the diode impedance. The constructions shown in FIGS. 10 and 11 provide an odd number of Schottky diodes monolithically integrated on substrate 12, with Schottky diode 70 being the odd Schottky diode.

Figure 12:
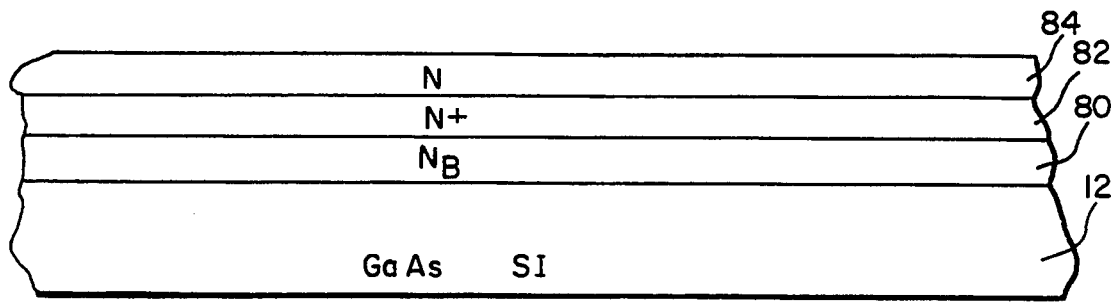

The process for fabricating the structure of FIG. 10 is shown beginning in FIG. 12. $N_B$ layer 80, N+ layer 82, and N layer 84 are epitaxially grown on GaAs semi-insulating substrate 12. Photoresist masking material is then applied, masked, and exposed, followed etching of the unexposed photoresist, N layer 84, N+ layer 82, and part of $N_B$ layer 80, followed by removal of the remaining photoresist, to yield mesa 86, FIG. 13. This is followed by deposition of Ta layer 88, Au layer 90, and Ta layer 92, FIG. 14, for forming Schottky contacts with N layer 84 therebelow, to be described. Photoresist is then applied and exposed through areas 94 and 96 of mask 98, FIG. 15, to define the Schottky array location, e.g. areas 94 and 96 define the locations for Schottky diodes 16 and 18 of array 14.

Figure 13:
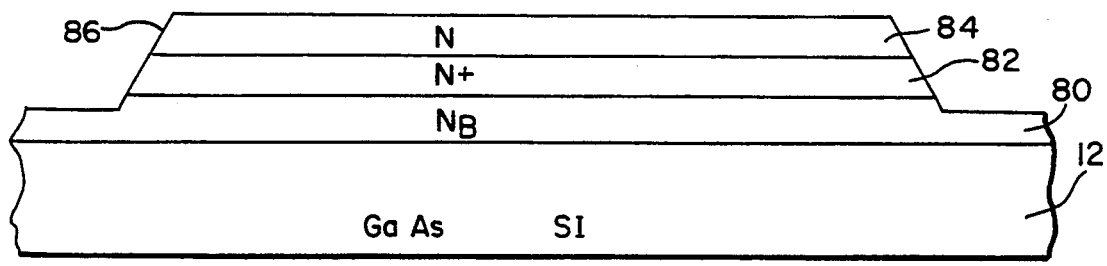
Figure 14:
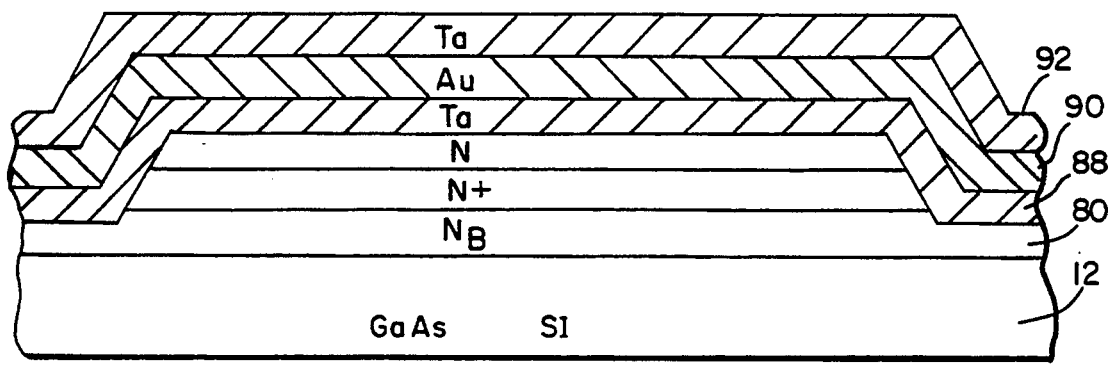
Figure 16:
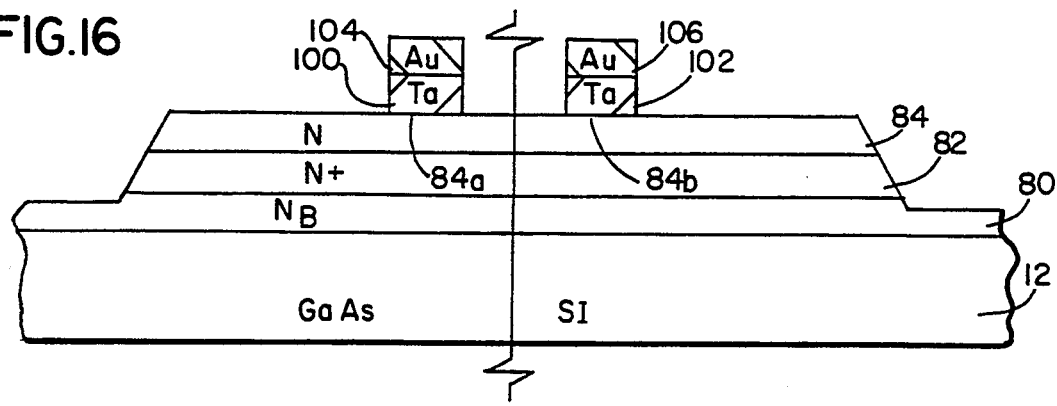
Figure 17:
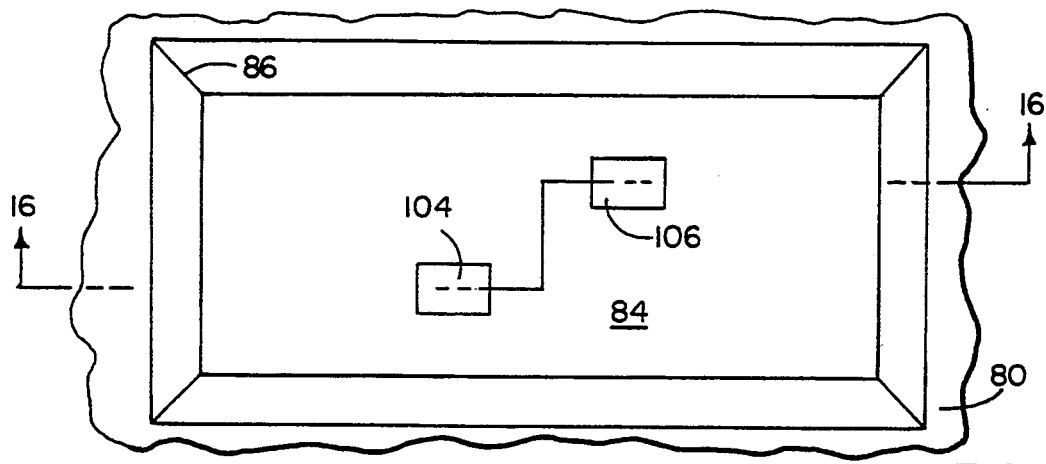

The processing shown in FIGS. 11-14 of U.S. Pat. No. 4,876,176, incorporated herein by reference, is then followed. The unexposed photoresist and Ta layer 92 therebelow are etched with $CF_4/O_2$, and then the remainder of the photoresist is removed, as shown in FIG. 12 of the '176 patent, followed by etching of Au layer 90 with $Ar/O_2$, as shown in FIG. 13 of the '176 patent, followed by $CF_4/O_2$ etching of top Ta layer 92 and bottom Ta layer 88 which is not covered by Au layer 90, as shown in FIG. 14 of the '176 patent, yielding the structure shown in FIG. 16, including Ta layers 100 and 102, and Au layers 104 and 106. A top view of the structure of FIG. 16 is shown in FIG. 17. Metallization 104 and 100 form a Schottky contact with N layer 84 at Schottky barrier junction 84a. Metallization 106 and 102 form a Schottky contact with N layer 84 at Schottky barrier junction 84b.

Figure 18:
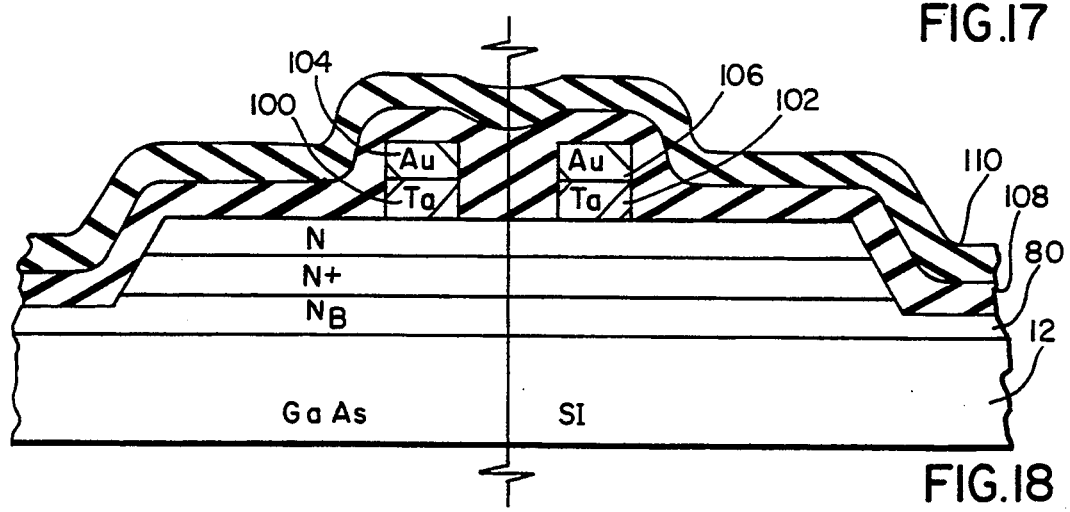

$SiO_2$ layer 108, FIG. 18, is then deposited, followed by deposition of $Si_3N_4$ layer 110. Photoresist is then applied, and exposed through areas 112 and 114 of mask 116, FIG. 19. The exposed photoresist and the $Si_3N_4$ layer 110 and $SiO_2$ layer 108 therebelow are etched using $CF_4$ or $CF_4/O_2$, to yield the structure shown in FIG. 20, and in top view in FIG. 21. The etched holes are shown at 118 and 120, where the $Si_3N_4$ and $SiO_2$ have been etched away. With photoresist 122 still in place, N layer 84 is etched, and N+ layer 82 is partially etched, followed by electron beam deposition of GeAu layer 124 and Au layer 126, yielding the structure shown in FIG. 22, including GeAu layer 128 and Au layer 130 in hole 118, and GeAu layer 132 and Au layer 134 in hole 120. Au layer 126, GeAu layer 124, and photoresist 122 over $Si_3N_4$ layer 110 are then removed by lift-off techniques, and the remaining GeAu layers 128, 132 and Au layers 130, 134 are annealed and sinter alloyed, to yield the structure in FIG. 23, including ohmic contacts 136 and 138.

Figure 23:
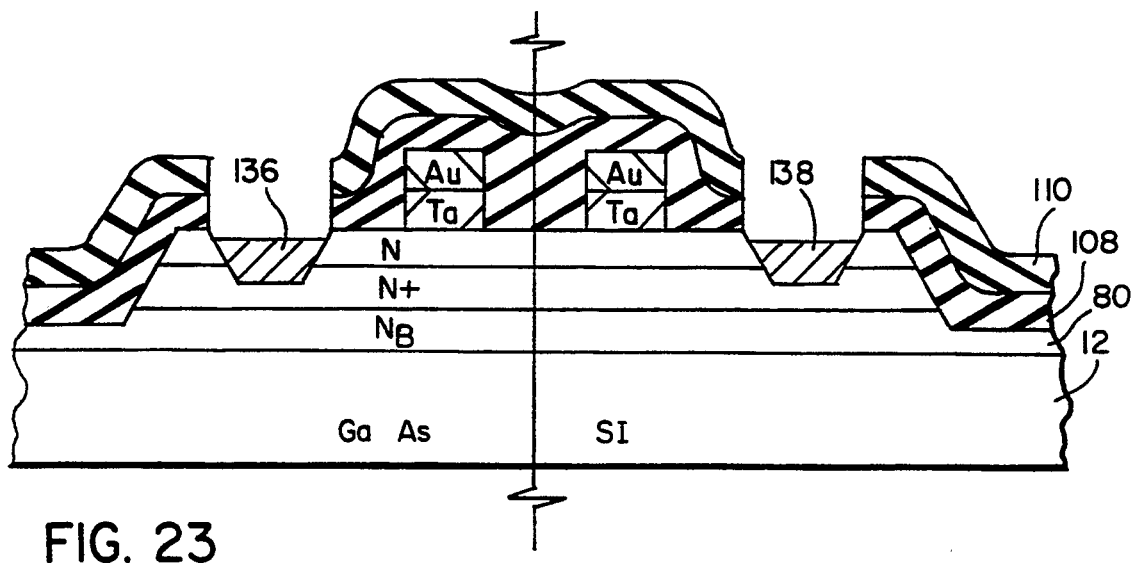
Figure 24:
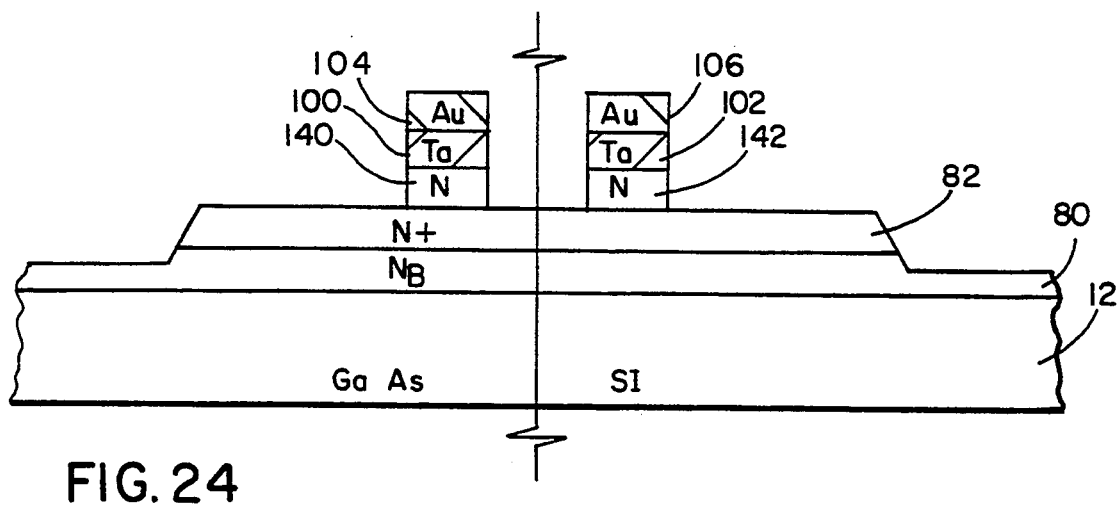

In an alternate embodiment, following the step in FIG. 16, N layer 84 is etched to yield the structure shown in FIG. 24, including N regions 140 and 142. The remaining noted steps through FIG. 23 are then performed, yielding the structure in FIG. 25, which is preferred for improved breakdown voltage. Continued processing of the structure of FIG. 25 will now be described, though the processing also applies to the structure of FIG. 23.

Figure 15:
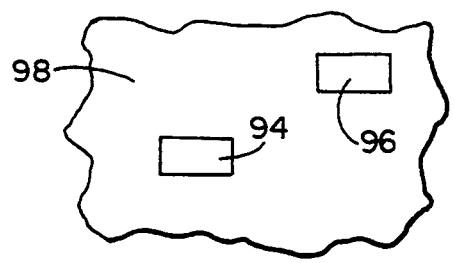
Figure 25:
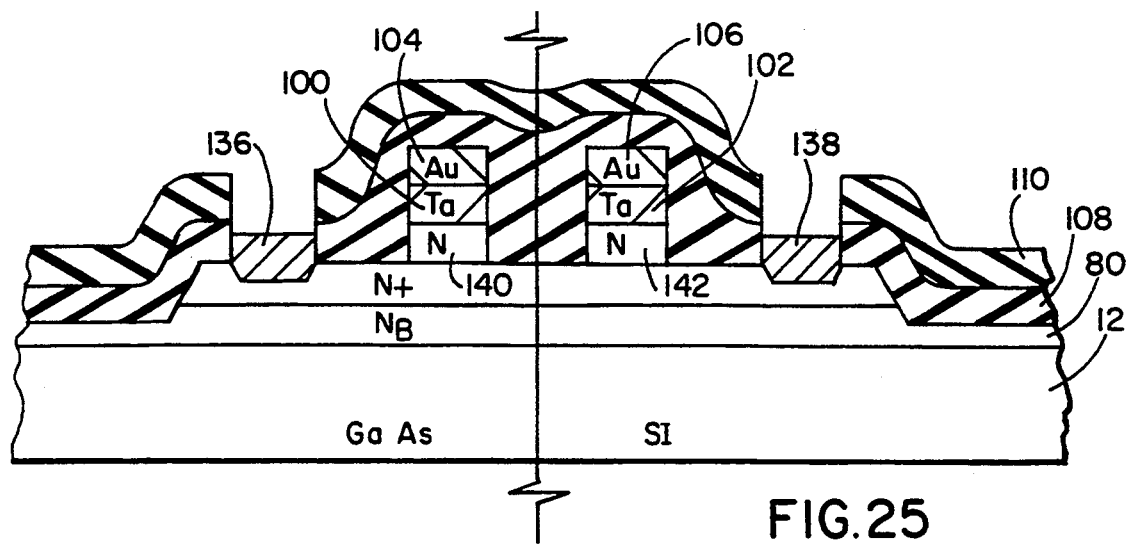
Figure 27:
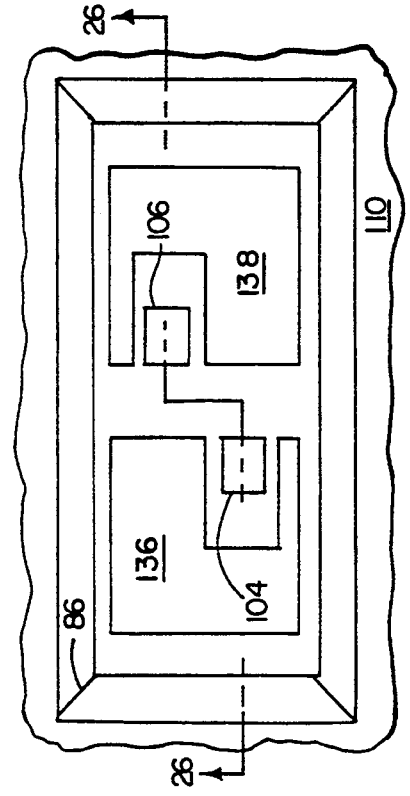
Figure 26:
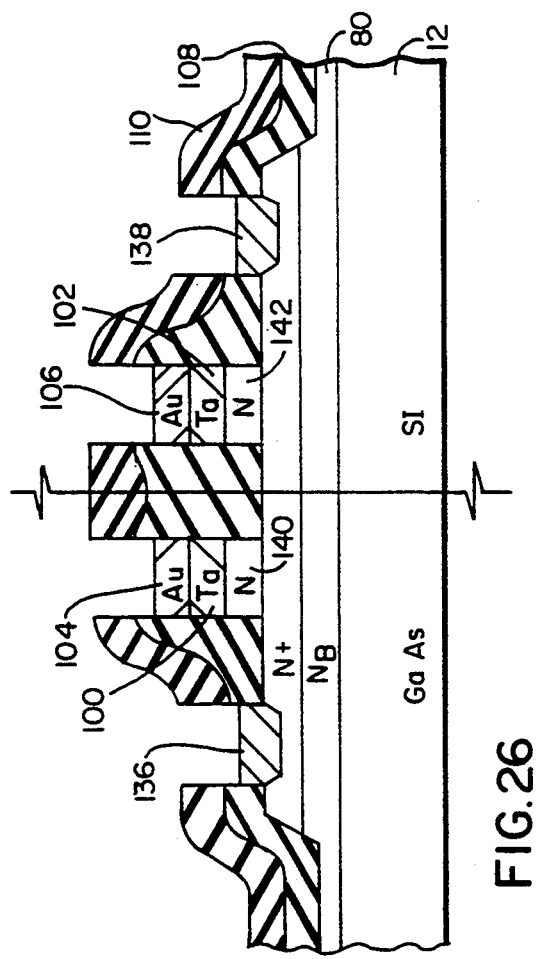
Figure 28:
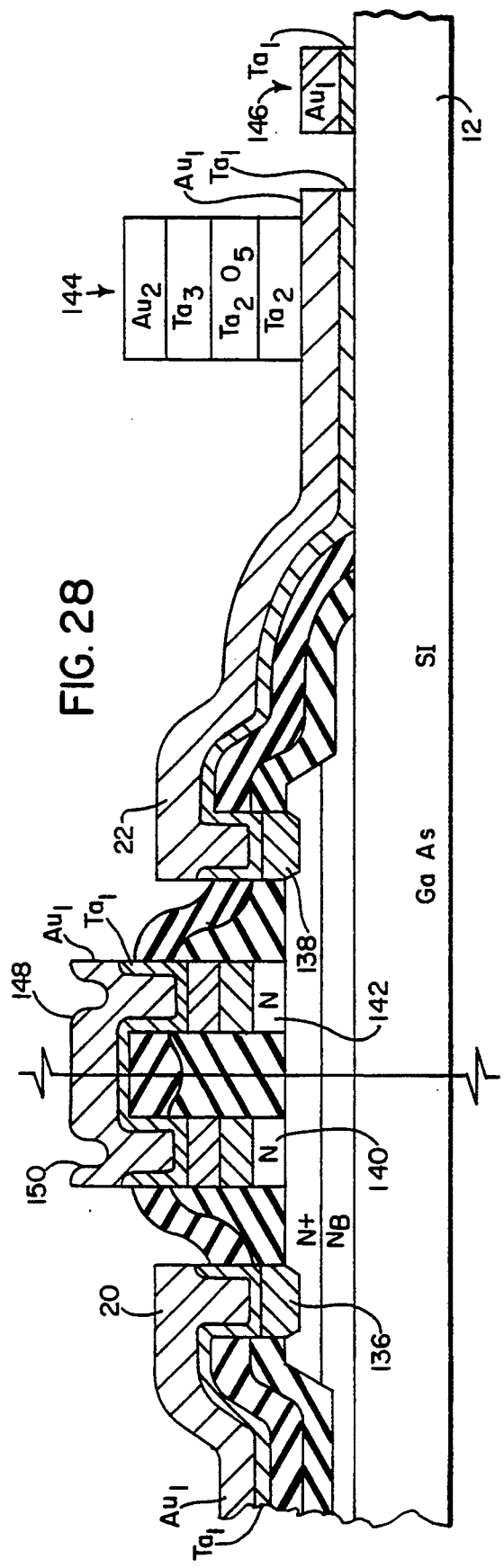
Figure 29:
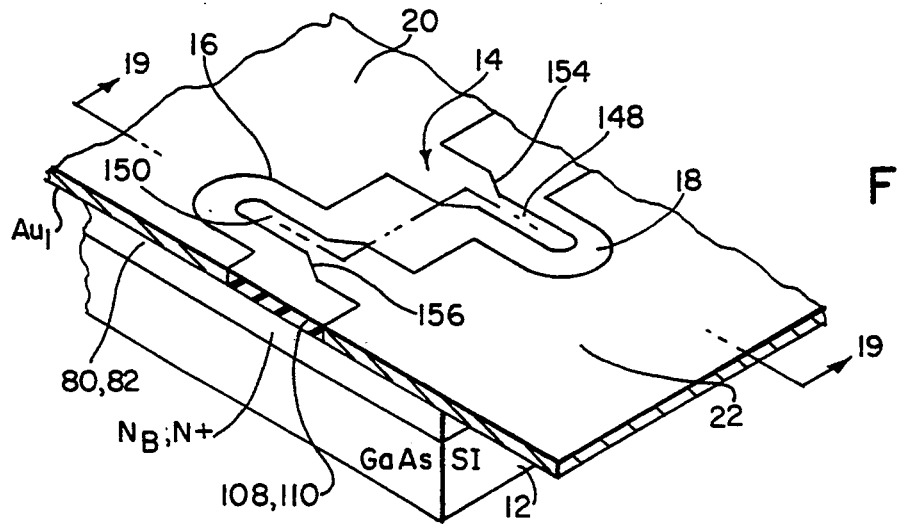

Photoresist is applied over the surface of the structure of FIG. 25, and is exposed through mask 98, FIG. 15, followed by etching with $CF_4$ or $CF_4/O_2$, followed by removal of the photoresist, to yield the structure shown in FIG. 26, and in top view in FIG. 27. The processing illustrated in FIGS. 1-5 of incorporated U.S. Pat. No. 4,876,176 is then performed, as described at column 4, line 56 through column 5, line 25 of the '176 patent, and if resistors are desired, the process illustrated in FIG. 6 of the '176 patent is performed, as described at column 5, lines 25-32 of the '176 patent. This yields the structure of FIG. 28, where the reference characters $Ta_1$, $Au_1$, $Ta_2$, $Ta_2O_5$, $Ta_3$, and $Au_2$, are used from the '176 patent where appropriate to facilitate understanding. Structure 144 is a capacitor, and structure 146 is an inductor, as shown in FIG. 5 of the '176 patent. The capacitor is provided by the oxide layer $Ta_2O_5$ between the metal layers. FIG. 29 is a perspective view of the left portion of FIG. 28 and shows diode pair array 14, FIGS. 10 and 11, including diodes 16 and 18, Au metallization 20 providing the cathode for diode 16 and the anode for diode 18, and Au metallization 22 providing the anode for diode 16 and the cathode for diode 18. Metallization 20 includes finger portion 148 providing the anode for diode 18. Metallization 22 includes finger portion 150 providing the anode for diode 16.

Figure 19:
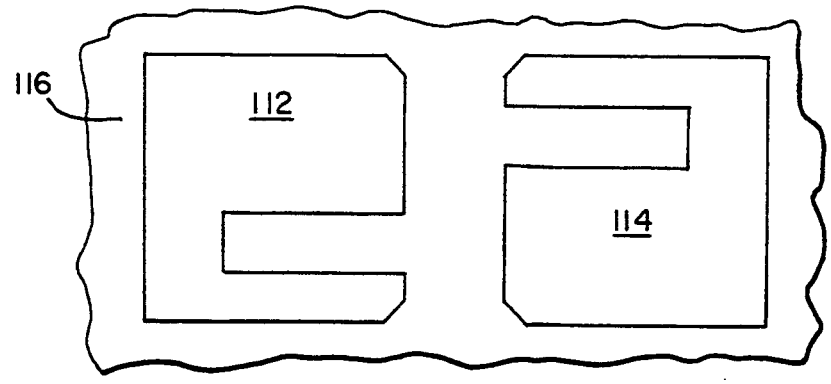
Figure 20:
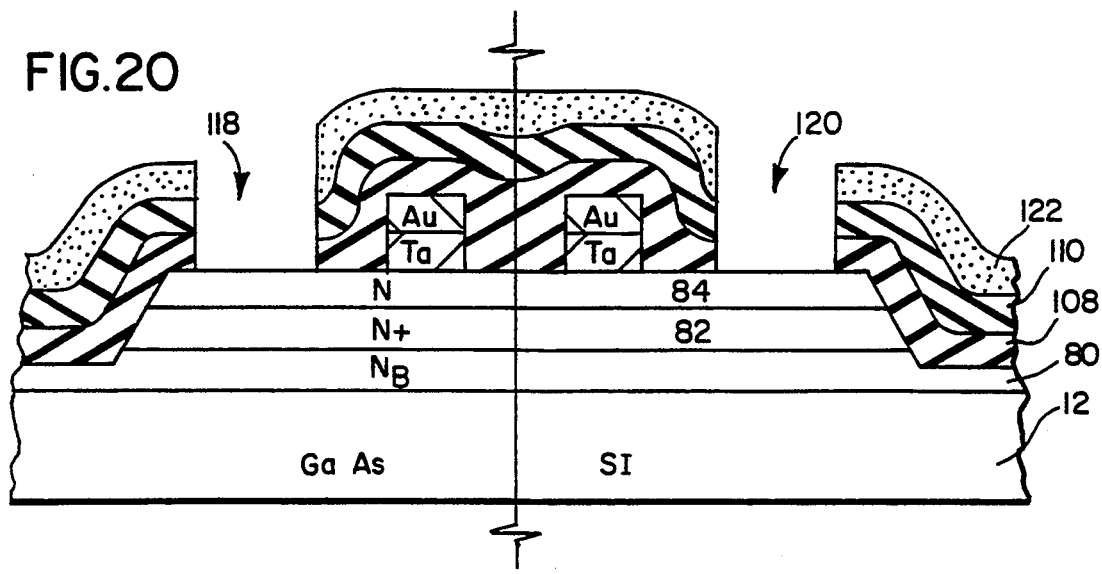
Figure 21:
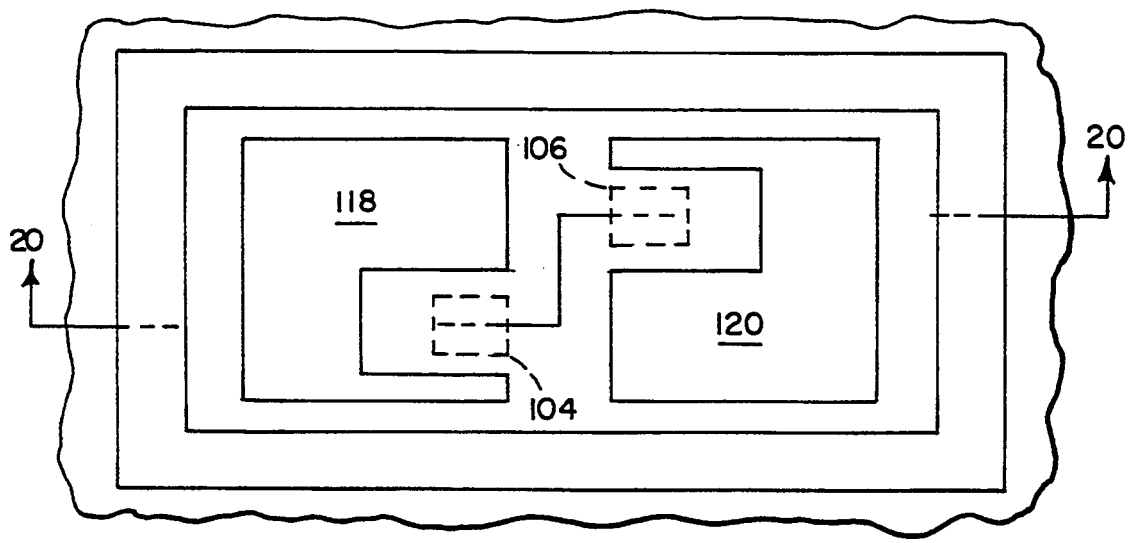
Figure 22:
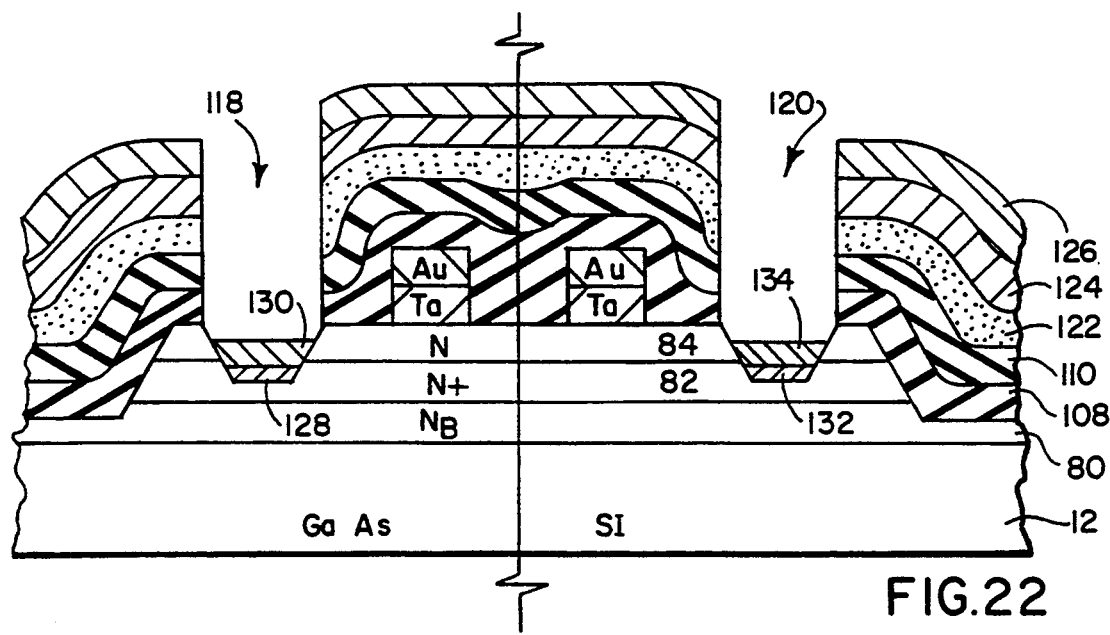
Figure 30:
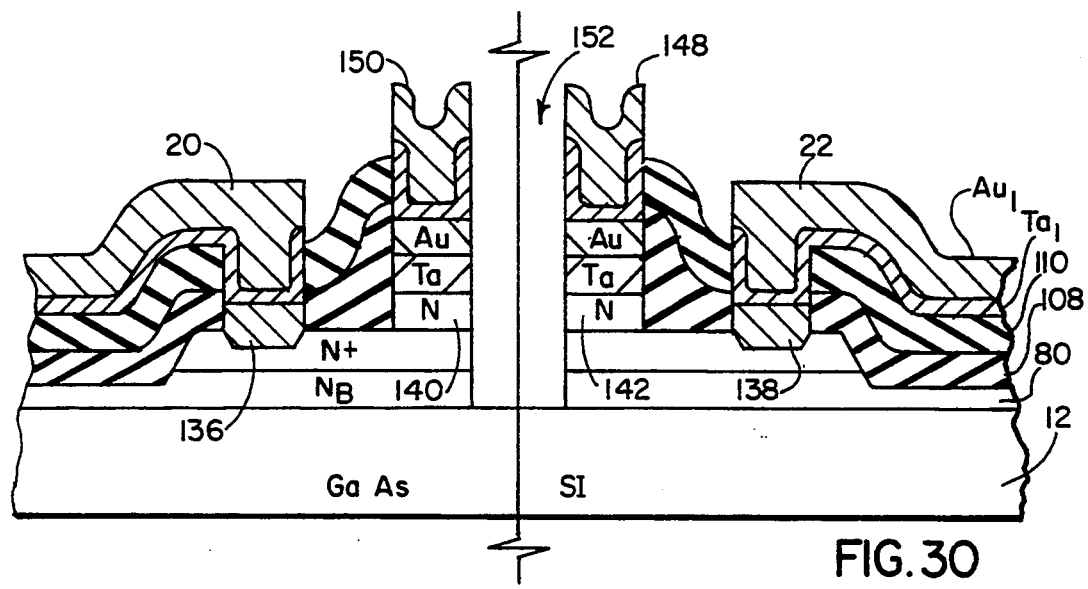
Figure 31:
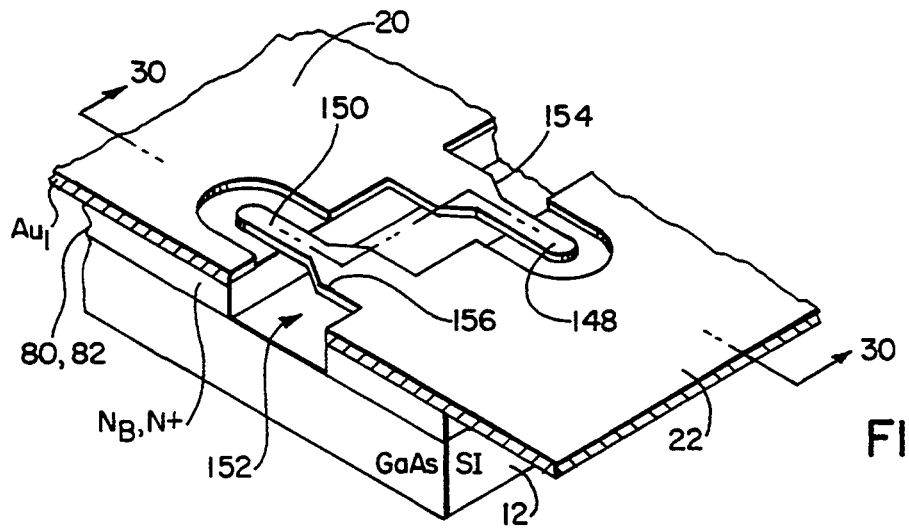

Photoresist is then applied, and exposed through mask 116, FIG. 19, followed by etching of $SiO_2$ layer 108 and $Si_3N_4$ layer 110 using a combination of chemical etching and plasma etching, preferably to etch the $Si_3N_4$ and $SiO_2$ using $CF_4$ or $CF_4/O_2$ followed by chemical etching of the $SiO_2$ using buffered HF, followed by etching of the N layer 84 if the structure of FIG. 23 was followed, and then by etching of the N+ layer 82 and $N_B$ layer 80, to yield the structure shown in FIG. 30, and in perspective view in FIG. 31, including air gap 152 below diode leads 154 and 156 adjacent respective finger portions 148 and 150.

The wafer is then immersed in a solution of $H_2O_2$, as described in U.S. Pat. No. 4,098,921, incorporated herein by reference, and in "An Improved High Temperature GaAs Schottky Junction" J. Calviello and J. Wallace, Conference on Active Semiconductor Devices for Microwave and Integrated Optics, Cornell University, Ithaca, N.Y., Aug. 19-21, 1975, to form a native oxide passivation layer 158 in air gap 152, FIG. 32. The process of FIGS. 7 and 8 of incorporated U.S. Pat. No. 4,876,176 is then followed, as described at column 5, lines 33+ of the '176 patent, to yield the structure shown in FIG. 33, including via holes such as 160 for grounding or other connection, and bridging connectors such as 162 for connecting circuits such as inductor 146 to capacitor 144.

FIGS. 34 and 35 show an MMIC, microwave and millimeter wave monolithic integrated circuit 200, and use like reference numerals from FIGS. 10 and 11 where appropriate to facilitate understanding. An amplifier 202 is monolithically integrated on the same substrate 12 with high power limiter 10. In the embodiment shown, amplifier 202 is a FET, field effect transistor, including a drain 204, gate 206, source 208, and gate-source junction 210, which is also schematically shown in dashed line at 210a. Schottky diode 70 and junction 210 are in parallel and in reverse polarity relative to each other, as shown at 210a, to form an anti-parallel array 212 of diodes 70 and 210 at 210a. The construction of FIGS. 34 and 35 has an odd number of Schottky diodes monolithically integrated on substrate 12, with Schottky diode 70 being the odd Schottky diode. The anti-parallel diode arrays 14, 34, 44, 56, 212 provide symmetrical clipping of the signal, with one less diode than otherwise required.

Figure 36:
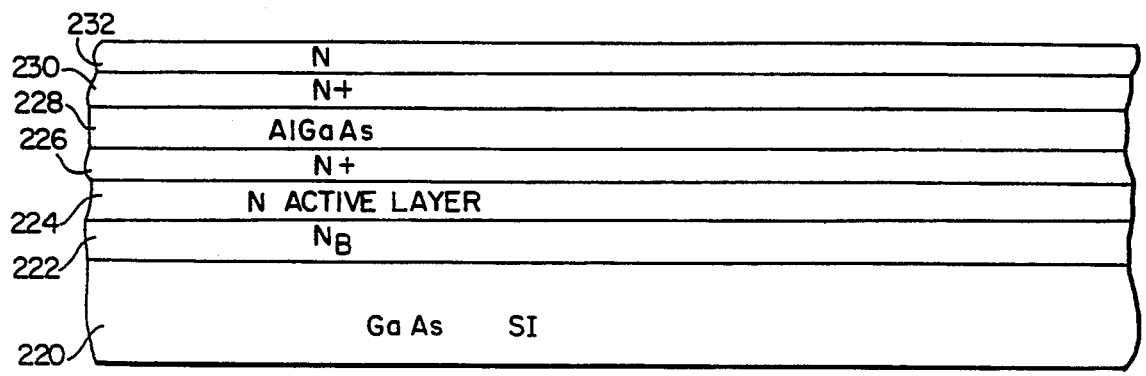
Figure 37:
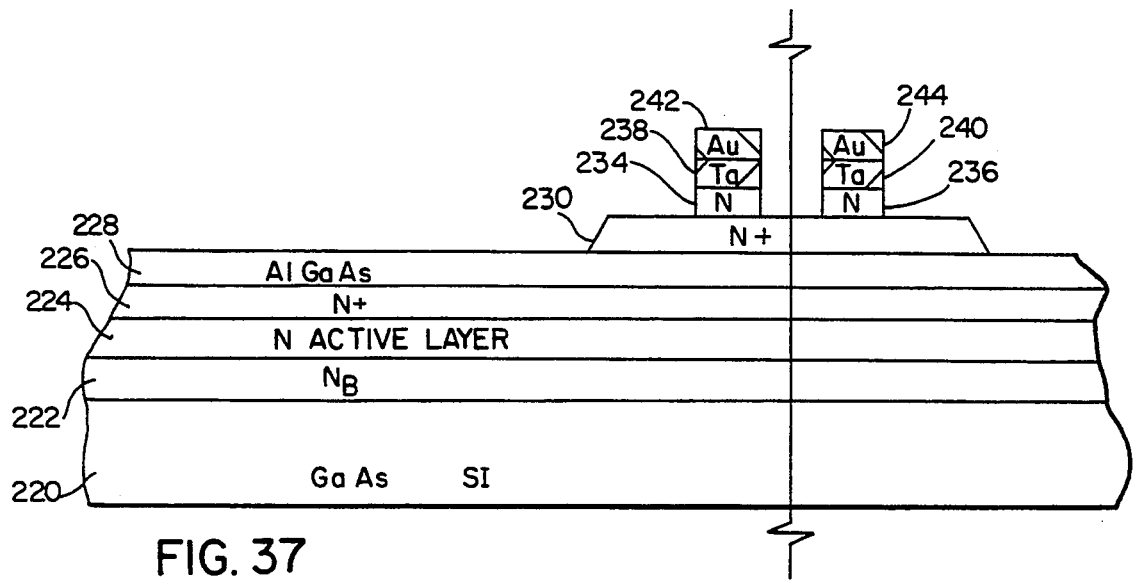
Figure 38:
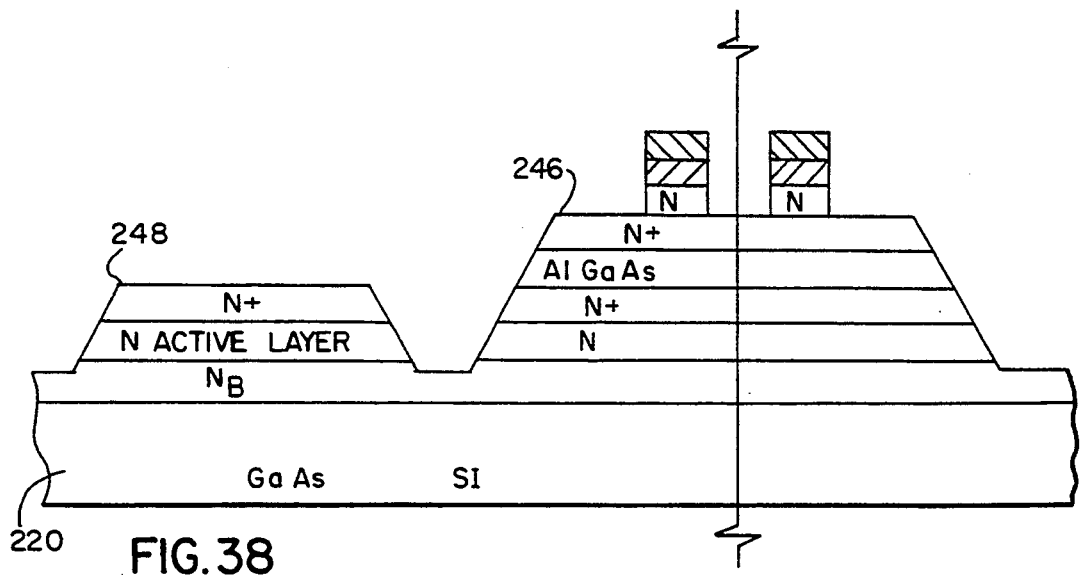
Figure 42:
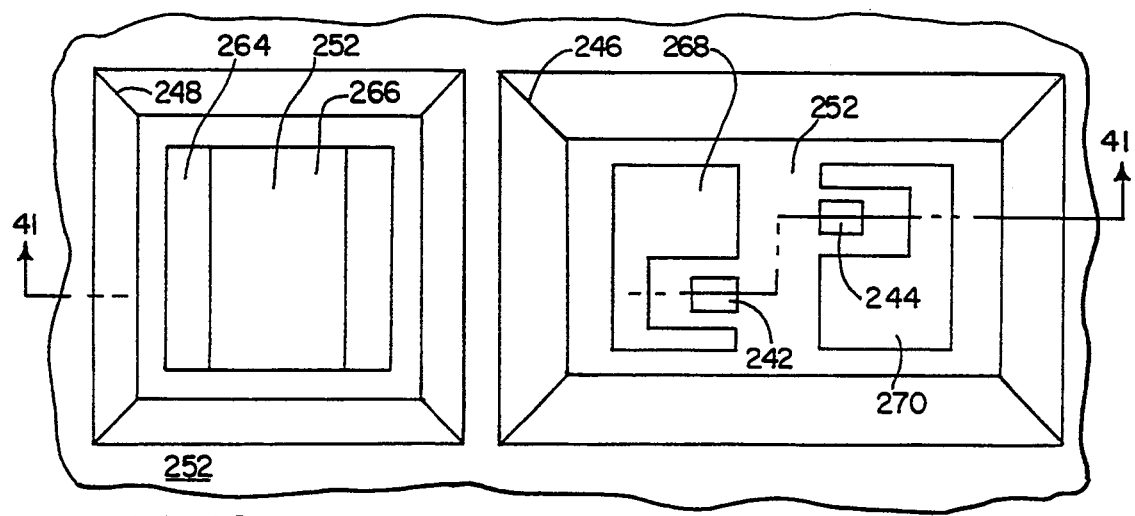
Figure 43:
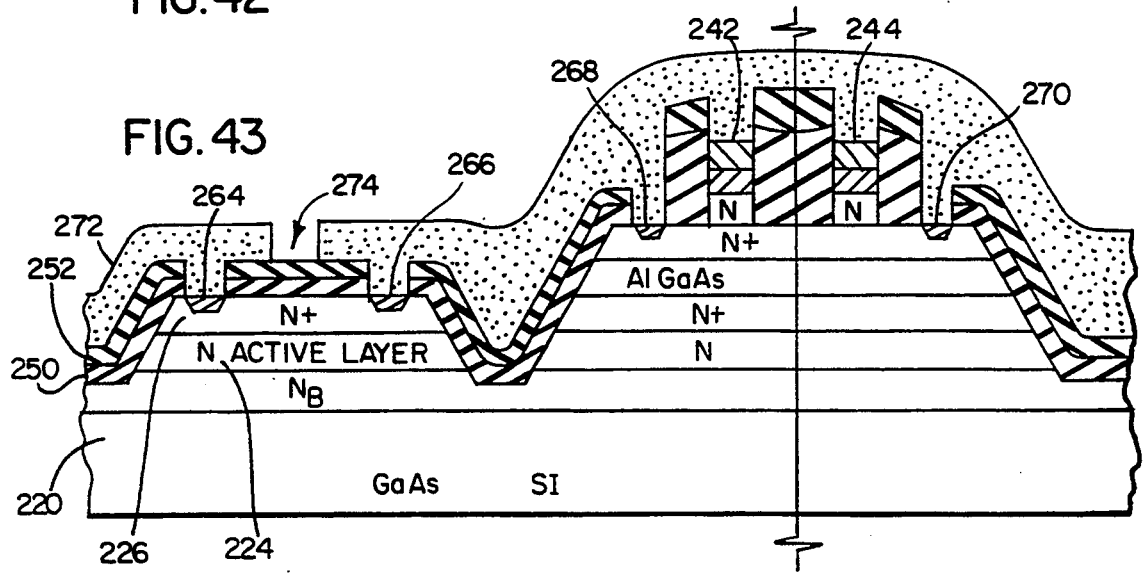
Figure 44:
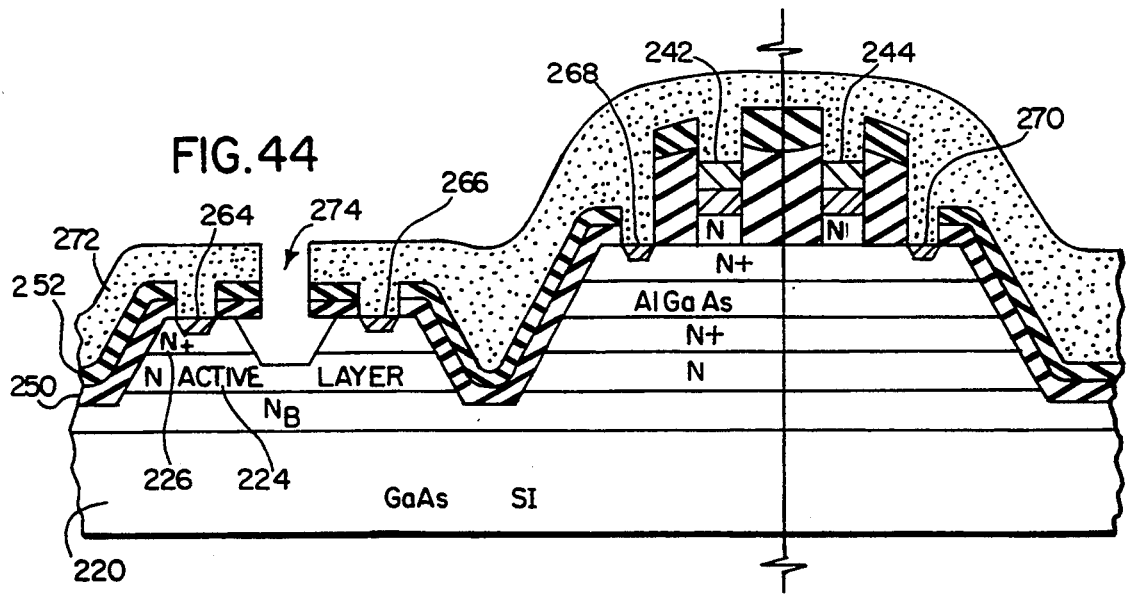
Figure 45:
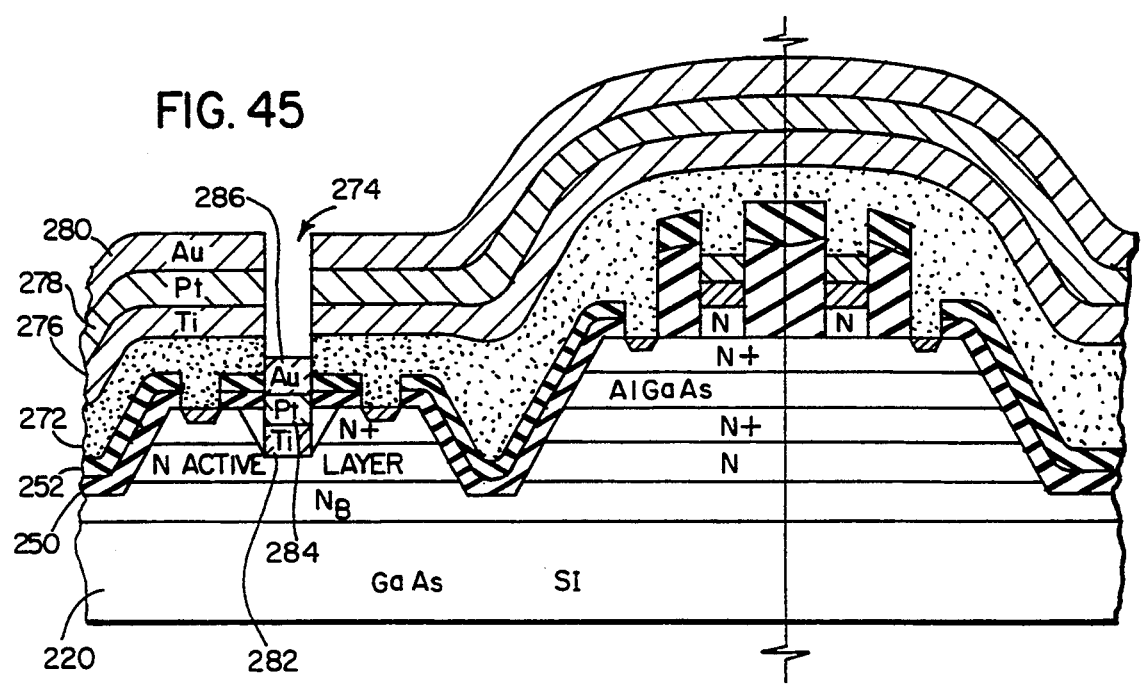

The processing for the structure of FIG. 34 is shown beginning in FIG. 36. Starting with GaAs semi-insulating substrate 220, and using molecular beam epitaxy, there is epitaxially grown $N_B$ buffer layer 222, active N layer 224, N+ layer 226, AlGaAs layer 228, N+ layer 230, and N layer 232. Active layer 224 is for the amplifier, e.g. FET such as a MESFET, MOSFET, HEMT, HBT (heterojunction bipolar transistor), etc. N+ layer 226 above active layer 224 is for low resistivity ohmic contact. The structure is then processed as above described in connection with FIGS. 13-16, and including the etching step of FIG. 24, to yield the structure shown in FIG. 37, including N regions 234, 236, Ta regions 238, 240, Au regions 242, 244, corresponding respectively to regions 140, 142, 100, 102, 104, 106, FIG. 24. The AlGaAs layer 228 is a stop etch layer for the noted processing of FIGS. 13-24. The stop etch layer 228 is then removed.

In the next step, the diode array mesa 246 and the FET mesa 248 are defined. Photoresist is applied, masked, and exposed, and then the N+ layer 226 and active layer 224 and part of the buffer layer 222 are etched, followed by removal of the photoresist, to yield the structure in FIG. 38. $SiO_2$ and $Si_3N_4$ are then deposited, as in FIG. 18, followed by application of photoresist, which is masked and exposed for the diode contacts, FIG. 19, and for the FET contact for source and drain, and then etched to yield the structure in FIG. 39, including $SiO_2$ layer 250, $Si_3N_4$ layer 252, and photoresist 254, corresponding respectively to layers 108, 110, 122, FIG. 20. Holes 256 and 258 correspond respectively to holes 118 and 120 in FIG. 20. Holes 260 and 262 provide source and drain contact holes, to be described. A monolayer of the N+ layer in holes 256, 258, 260, 262 is then etched to clean the surface for ohmic contact definition, followed by the processes described above in connection with FIGS. 22 and 23, including electron beam deposition of GeAu and Au layers comparably to layers 124 and 126, and including the noted lift-off and annealing, to yield the structure shown in FIG. 40, including ohmic contacts 264 and 266 for the FET, and ohmic contacts 268 and 270 which are comparable to contacts 136 and 138 in FIG. 23. Photoresist is then applied, masked, exposed, and etched to open holes to the Schottky Au regions 242 and 244, as in FIGS. 26 and 27, resulting in the structure in FIG. 41, and in top view in FIG. 42.

Figure 46:
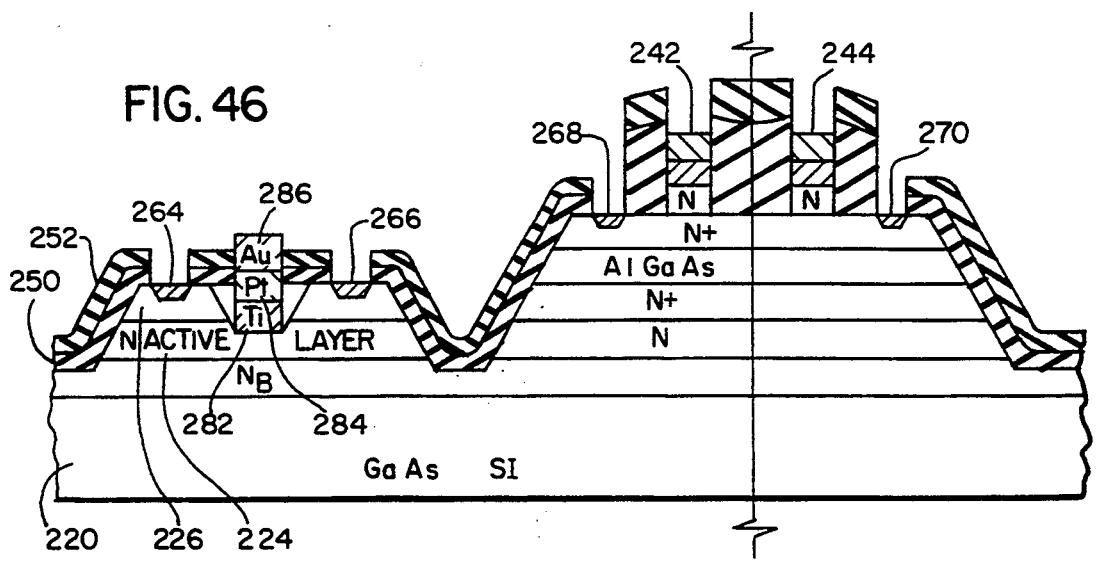
Figure 47:
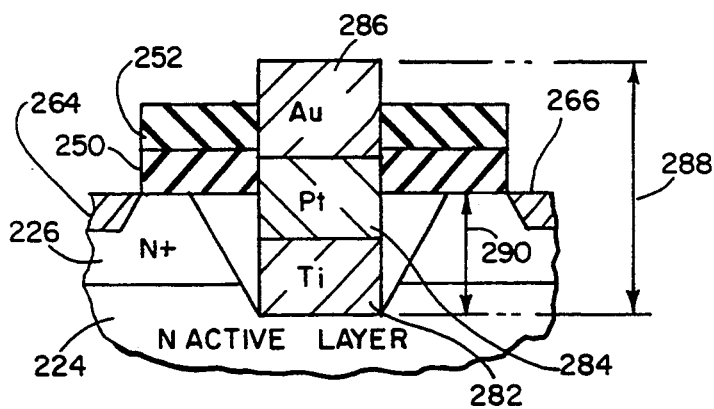
Figure 48:
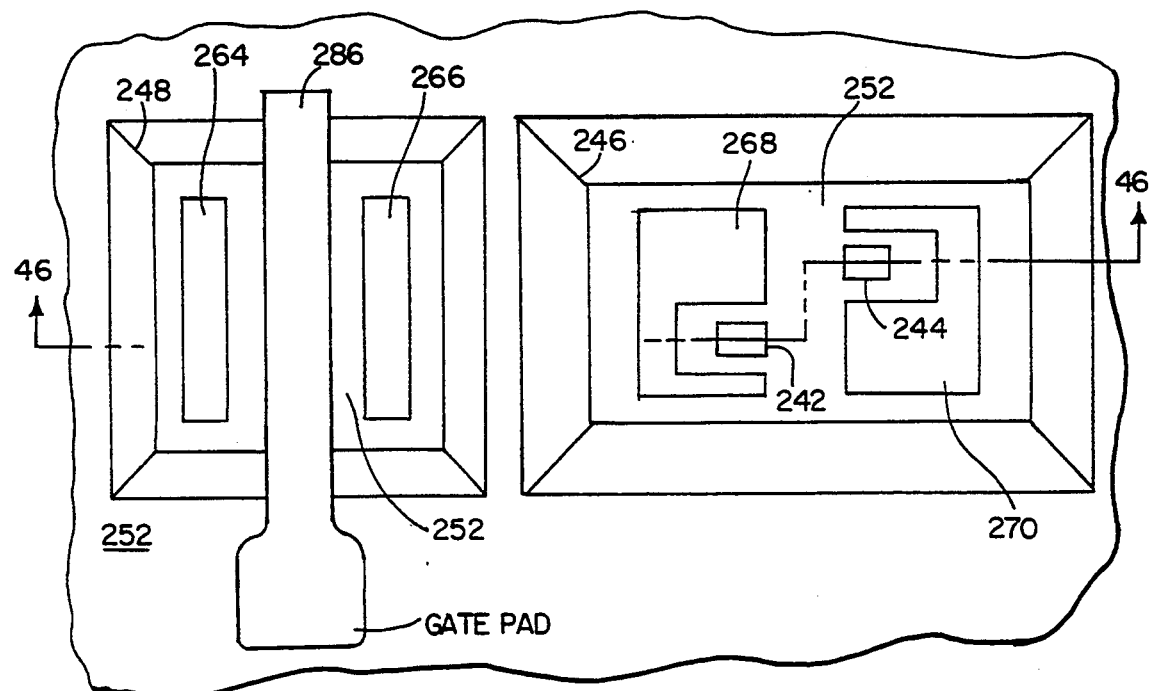

In the next step, PMMA (poly methyl methacrylate) is applied and EBL (electron beam lithography) is used for gate lengths less than 0.5 microns, or alternatively photoresist is applied for gate lengths greater than 0.5 microns. The PMMA is exposed by EBL, or the photoresist is masked and exposed, followed by removal of the exposed PMMA or photoresist, to yield the structure in FIG. 43, including PMMA or photoresist layer 272, and hole 274. The $Si_3N_4$ layer 252, $SiO_2$ layer 250, N+ layer 226, and part of N active layer 224 in hole 274 are then etched, FIG. 44, to define the FET gate. Ti layer 276, Pt layer 278, and Au layer 280 are then deposited, yielding the structure in FIG. 45, including Ti region 282, Pt region 284, and Au region 286 in hole 274. The metals are then lifted off, and then the photoresist or PMMA layer 272 is dissolved, yielding the structure in FIG. 46. The structure provides a passivated conducting channel including the recessed channel. The metallization is deposited by evaporation in a vacuum, and the metal layers 282, 284, 286 have a total height greater than the height of the recessed channel in N+ layer 226 and the portion of active layer 224. As shown in FIG. 47, the total height 288 of metallization layers 282, 284, 286 is greater than the height 290 of the recessed channel. Height 288 is also greater than height 290 plus the thickness of $SiO_2$ layer 250 and $Si_3N_4$ layer 252, such that gold layer 286 is above the top of layer 252. A top view of the structure of FIG. 46 is shown in FIG. 48. The processing is then continued as described above beginning with FIG. 28 to deposit the seven metal and dielectric layers to define the microwave and millimeter wave capacitors, inductors, etc., including the above noted via holes and bridging connectors, to provide the circuit of FIG. 34.

Figure 49:
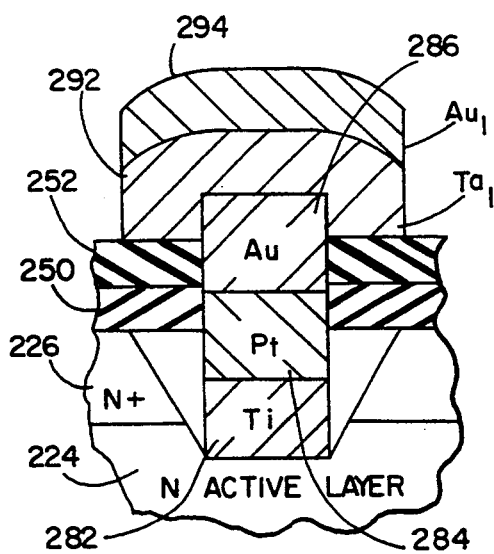
Figure 50:
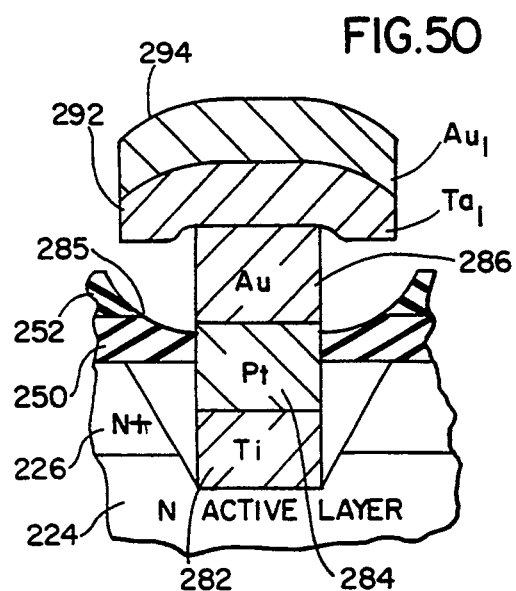

The gate contact structure is shown in FIG. 49, including portion 292 of the above noted $Ta_1$ layer, and portion 294 of the above noted $Au_1$ layer. In another embodiment, a T-type gate is provided by etching at 285 portions of the $Si_3N_4$ layer 252 and $SiO_2$ layer 250 adjacent contact metallizations 286 and 284, to yield the structure in FIG. 50, to decrease parasitic capacitance between the gate and source and between the gate and drain.

It is recognized that various equivalents, alternatives and modifications are possible within the scope of the appended claims.

We claim:

1. A high power limiter for a low noise amplifier, comprising a substrate, a first anti-parallel array of Schottky diodes monolithically integrated on said substrate and comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, a second anti-parallel array of Schottky diodes monolithically integrated on said substrate and coupled in series with said first anti-parallel array between said conductor and said ground reference, said second anti-parallel array comprising third and fourth Schottky diodes arranged in parallel and in reverse polarity relative to each other between a second input node and a second output node, said second input node being coupled to said first output node, said second output node being coupled to said ground reference.

2. A high power limiter for a low noise amplifier, comprising a substrate, a first anti-parallel array of Schottky diodes monolithically integrated on said substrate and comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, a second anti-parallel array of Schottky diodes monolithically integrated on said substrate and coupled in parallel with said first anti-parallel array between said conductor and said ground reference, said second anti-parallel array comprising third and fourth Schottky diodes arranged in parallel and in reverse polarity relative to each other between a second input node and a second output node, said second input node being coupled to said conductor intermediate said first and second ends of said conductor, said second output node being coupled to said ground reference.

3. The invention according to claim 2 comprising a third anti-parallel array of Schottky diodes monolithically integrated on said substrate and coupled in series with said first anti-parallel array between said conductor and said ground reference, said third anti-parallel array comprising fifth and sixth Schottky diodes arranged in parallel and in reverse polarity relative to each other between a third input node and a third output node, said third input node being coupled to said first output node, said third output node being coupled to said ground reference, and comprising a fourth antiparallel array of Schottky diodes monolithically integrated on said substrate and coupled in series with said second anti-parallel array between said conductor and said ground reference, said fourth anti-parallel array comprising seventh and eighth Schottky diodes arranged in parallel and in reverse polarity relative to each other between a fourth input node and a fourth output node, said fourth input node being coupled to said second output node, said fourth output node being coupled to said ground reference.

4. A high power limiter providing impedance transformation and matching for a low noise amplifier without a separate noise matching network, comprising a substrate, a first anti-parallel array of Schottky diodes monolithically integrated on said substrate and comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, said conductor including inductor means transforming the impedance at said first end to a different impedance at said second end matching said low noise amplifier, such that said limiter has unequal input and output impedances, the output impedance being less than the input impedance.

5. The invention according to claim 4 wherein said inductor means comprises first and second inductors connected in series with each other between said first and second ends of said conductor, and wherein said first input node is coupled to said conductor intermediate said first and second inductors.

6. A high power limiter providing impedance transformation and matching for a low noise amplifier without a separate noise matching network, comprising a substrate, a first anti-parallel array of Schottky diodes monolithically integrated on said substrate and comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, said conductor including inductor means transforming the impedance at said first end to a different impedance at said second end matching said low noise amplifier, wherein said inductor means comprises first and second inductors connected in series with each other between said first and second ends of said conductor, and wherein said first input node is coupled to said conductor intermediate said first and second inductors, and comprising a third Schottky diode and first and second resonating capacitors monolithically integrated on said substrate, said first resonating capacitor and said first anti-parallel array being connected in series between said ground reference and said conductor intermediate said first and second inductors, said first resonating capacitor tuning out the parasitic inductance of said first and second Schottky diodes to reduce the reactive portion of the diode impedance, said third Schottky diode and said second resonating capacitor being connected in series between said ground reference and said conductor intermediate said second inductor and said second conductor end, said second resonating capacitor tuning out the parasitic inductance of said third Schottky diode to reduce the reactive portion of the diode impedance.

7. A high power limiter for a low noise amplifier, comprising a substrate, a first anti-parallel array of Schottky diodes monolithically integrated on said substrate and comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said conductor comprising first and second inductors connected in series with each other between said first and second ends of said conductor, said first input node being coupled to said conductor intermediate said first and second inductors, said first output node being coupled to a ground reference, first and second capacitors and a third Schottky diode monolithically integrated on said substrate, said first capacitor and said first anti-parallel array being connected in series between said ground reference and said conductor intermediate said first and second inductors, said second capacitor and said third Schottky diode being conducted in series between said ground reference and said conductor intermediate said second inductor and said second end of said conductor.

8. A high power limiter for a low noise amplifier, comprising a substrate, a conductor on said substrate having a first end providing a limiter input for receiving a signal and a second end providing a limiter output for connection to said low noise amplifier and including first and second inductors connected in series with each other between said first and second ends of said conductor and including a first connection node between said first and second inductors and a second connection node between said second inductor and said second end of said conductor, first, second and third capacitors monolithically integrated on said substrate, first, second, third and fourth anti-parallel arrays of Schottky diodes monolithically integrated on said substrate, said first anti-parallel array comprising first and second Schottky diodes arranged in parallel and in reverse polarity relative to each other between a first input node and a first output node, said second anti-parallel array comprising third and fourth Schottky diodes arranged in parallel and in reverse polarity relative to each other between a second input node and a second output node, said third anti-parallel array comprising fifth and sixth Schottky diodes arranged in parallel and in reverse polarity relative to each other between a third input node and a third output node, said fourth anti-parallel array comprising seventh and eighth Schottky diodes arranged in parallel and in reverse polarity relative to each other between a fourth input node and a fourth output node, a ninth Schottky diode monolithically integrated on said substrate and coupled in series with said third capacitor between said second connection node and a ground reference, said first capacitor being connected between said first connection node and said first input node, said first output node being connected to said second input node, said second output node being connected to said ground reference, said second capacitor being connected between said first connection node and said third input node, said third output node being connected to said fourth input node, said fourth output node being connected to said ground reference.

9. A high power limiter for a low noise amplifier comprising a substrate, an odd number of Schottky diodes monolithically integrated on said substrate comprising a first anti-parallel array of Schottky diodes comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, a third said Schottky diode coupled between said ground reference and said conductor, said third Schottky diode being the odd Schottky diode, wherein said first anti-parallel array is coupled to said conductor at a first connection node, said third Schottky diode is coupled to said conductor at a second connection node, and said conductor includes an inductor between said first and second connection nodes.

10. A high power limiter for a low noise amplifier comprising a substrate, an odd number of Schottky diodes monolithically integrated on said substrate comprising a first anti-parallel array of Schottky diodes comprising first and second Schottky diodes arranged in parallel and in reverse polarity relative to each other between a first input node and a first output node, a conductor on said substrate having a first end providing a limiter input for receiving a signal and a second end providing a limiter output for connection to said low noise amplifier, said first input node being coupled to said conductor intermediate said first and second ends of said conductor, said first output node being coupled to a ground reference, a third said Schottky diode coupled between said ground reference and said conductor, said third Schottky diode being the odd Schottky diode, wherein said first anti-parallel array is coupled to said conductor at a first connection node, said third Schottky diode is coupled to said conductor at a second connection node, and said conductor includes first and second inductors connected in series with each other between said first and second ends of said conductor, said first inductor being between said first end of said conductor and said first connection node, said second inductor being between said first connection node and said second connection node, said second connection node being between said second inductor and said second end of said conductor.

11. An MMIC, microwave and millimeter wave monolithic integrated circuit, comprising a substrate, an amplifier monolithically integrated on said substrate, a high power limiter integrated on the same said substrate with said amplifier, wherein said limiter comprises a plurality of Schottky diodes, wherein said amplifier comprises a FET, field effect transistor, monolithically integrated on said substrate and having a junction, and comprising a first anti-parallel array of Schottky diodes monolithically integrated on said substrate and comprising a first and second Schottky diodes arranged in parallel and in reverse polarity relative to each other between a first input node and a first output node, a conductor on said substrate having a first end providing a limiter input for receiving a signal and a second end providing a limiter output coupled to said FET, said first input node being coupled to said conductor intermediate said first and second ends of said conductor, said first input node being coupled to a ground reference, and comprising a third Schottky diode monolithically integrated on said substrate, wherein said third Schottky diode and said junction are in parallel and in reverse polarity relative to each other to form a second anti-parallel array of diodes, wherein said FET comprises a gate, source and drain, and wherein said third Schottky diode is arranged in parallel and in reverse polarity with the gate to source junction of said FET, and comprising first and second resonating capacitors monolithically integrated on said substrate, said first resonating capacitor being connected in series with said first anti-parallel array between said conductor and said ground reference and tuning out the parasitic inductance of said first and second Schottky diodes to reduce the reactive portion of the diode impedance, said second resonating capacitor being connected in series with said third Schottky diode between said conductor and said ground reference and tuning out the parasitic inductance of said third Schottky diode to reduce the reactive portion of the diode impedance.

12. An MMIC, microwave and millimeter wave monolithic integrated circuit, comprising a substrate, an amplifier monolithically integrated on said substrate, a high power limiter integrated on the same said substrate with said amplifier, wherein said limiter comprises a plurality of Schottky diodes, wherein said amplifier comprises a FET, field effect transistor, monolithically integrated on said substrate and having a junction, and comprising a first anti-parallel array of Schottky diodes monolithically integrated on said substrate and comprising a first and second Schottky diodes arranged in parallel and in reverse polarity relative to each other between a first input node and a first output node, a conductor on said substrate having a first end providing a limiter input for receiving a signal and a second end providing a limiter output coupled to said FET, said first input node being coupled to said conductor intermediate said first and second ends of said conductor, said first output node being coupled to a ground reference, and comprising a third Schottky diode monolithically integrated on said substrate, wherein said third Schottky diode and said junction are in parallel and in reverse polarity relative to each other to form a second anti-parallel array of diodes, wherein said FET comprises a gate, source and drain, and wherein said third Schottky diode is arranged in parallel and in reverse polarity with the gate to source junction of said FET, and wherein said first anti-parallel array is coupled to said conductor at a first connection node, and said third Schottky diode is coupled to said conductor at a second connection node, and said conductor includes first and second inductors connected in series with each other between said first and second ends of said conductor, said first inductor being between said first end of said conductor and said first connection node, said second inductor being between said first connection node and said second connection node, said second connection node being between said second inductor and said gate of said FET.

* * * * *

UNITED STATES PATENT AND TRADEMARK OFFICE
CERTIFICATE OF CORRECTION

PATENT NO. : 5,341,114
DATED : August 23, 1994
INVENTOR(S) : JOSEPH A. CALVIELLO ET AL It is certified that error appears in the above-identified patent and that said Letters Patent is hereby corrected as shown below:

ON THE TITLE PAGE

[56] OTHER PUBLICATIONS: 2nd column, line 1, delete "Microwves" and substitute therefor -- Microwaves --; 2nd column, line 2, delete "Uiversity" and substitute therefor -- University --.

CLAIM 7, Col. 12, Line 28, delete "conducted" and substitute therefor -- connected --; CLAIM 8, Col. 12, Line 37, delete "said-first" and substitute therefor -- said first --; CLAIM 10, Col. 13, Line 44, after "," delete "and"; CLAIM 11, Col. 13, Line 63, after "comprising" delete "a"; CLAIM 11, Col. 14, Line 5, delete "input" and substitute therefor -- output --; CLAIM 12, Col. 14, Line 37, after "comprising" delete "a".

Signed and Sealed this

Fifteenth Day of November, 1994

Attest:

BRUCE LEHMAN

Attesting Officer     Commissioner of Patents and Trademarks